United States Patent
Haruhana et al.

[19]

[11] Patent Number: 6,165,878
[45] Date of Patent: Dec. 26, 2000

[54] METHOD OF MANUFACTURING SEMICONDUCTOR DEVICE

[75] Inventors: Hideyo Haruhana; Keiichi Higashitani; Motoshige Igarashi; Masao Sugiyama, all of Tokyo, Japan

[73] Assignee: Mitsubishi Denki Kabushiki Kaisha, Tokyo, Japan

[21] Appl. No.: 09/221,128

[22] Filed: Dec. 28, 1998

[30] Foreign Application Priority Data

Aug. 7, 1998 [JP] Japan .................. P10-224341

[51] Int. Cl.[7] .................. H01L 21/3205; H01L 21/4763
[52] U.S. Cl. .......................... 438/586; 438/585
[58] Field of Search .................. 438/586, 945, 438/950, 585, 584; H01L 21/28, 21/3065, 21/336, 21/78, 21/3205, 21/4763

[56] References Cited

U.S. PATENT DOCUMENTS

| | | | |
|---|---|---|---|
| 5,059,548 | 10/1991 | Kim | 438/396 |
| 5,174,858 | 12/1992 | Yamamoto et al. | 438/301 |
| 5,668,052 | 9/1997 | Matsumoto et al. | 438/624 |

FOREIGN PATENT DOCUMENTS 10-22233  1/1998  Japan .

OTHER PUBLICATIONS

S. Wolf and R.N. Tauber, Silicon Processing for the VLSI Era—Process Technology, (Lattice Press, California, 1986), vol. 1, pp. 418–420.

S. Wolf, Silicon Processing for the VLSI Era—Process Integration, (Lattice Press, California, 1990), vol. 2, pp. 238–239.

*Primary Examiner*—Richard Elms
*Assistant Examiner*—Christian D. Wilson
*Attorney, Agent, or Firm*—Oblon, Spivak, McClelland, Maier & Neustadt, P.C.

[57] ABSTRACT

A method of manufacturing a semiconductor device which prevents a short circuit between a gate electrode and a diffusion layer region if a contact hole is shifted from its proper position. A material having an etch selectivity to an interlayer insulation film is formed over the gate electrode to serve as a cover against the formation of a contact hole. A material is not formed over an interconnect line which is required to be exposed to a contact hole.

18 Claims, 29 Drawing Sheets

METHOD OF MANUFACTURING SEMICONDUCTOR DEVICE

BACKGROUND OF THE INVENTION

1. Field of the Invention

The present invention relates to the prevention of a short circuit in a semiconductor device.

2. Description of the Background Art

FIG. 43A shows the structure of a background art semiconductor device. The surface of a semiconductor substrate 1 is divided into two regions: an element isolation region 2 in which an isolation element 2a employing the LOCOS process or a trench is formed; and an active region 3 in which MOS structure elements and the like are formed. A gate insulation film 5a is formed on the surface of the isolation element 2a, and an interconnect line 4a is formed on the gate insulation film 5a. Sidewalls 6a are formed on the side faces of the interconnect line 4a. Gate insulation films 5b are formed on the surface of the active region 3, and gate electrodes 4b are formed on the respective gate insulation films 5b. Sidewalls 6b are formed on the side faces of each of the gate electrodes 4b. Source and drain regions which constitute a MOS structure element with each of the gate insulation films 5b and each of the gate electrodes 4b are formed in the active region 3, but are not shown in FIG. 43A for purposes of simplicity. The gate insulation film 5a under the interconnect line 4a is shown as formed at the same time as the gate insulation films 5b, but is not required functionally.

An interlayer insulation film 7 is once formed to cover the entire top surface of the above described structure. Then, a contact hole 8a is formed in the interlayer insulation film 7 over the element isolation region 2 for electrical connection to the interconnect line 4a, and contact holes 8b are formed in the interlayer insulation film 7 over the active region 3 for electrical connection to the source and drain regions (not shown). The contact holes 8a and 8b are filled with a conductive material for contact later.

In the structure of the semiconductor device as above described, the contact holes 8a and 8b are not formed as designed in some cases. This is prone to occur, for example, when the photolithographic technique is used to form the contact holes 8a and 8b.

FIG. 43B shows the structure of the background art semiconductor device when the contact holes 8a and 8b are shifted slightly leftwardly in cross-section from the designed position as the result of an insufficient photomask alignment precision during manufacturing the structure of FIG. 43A, for example. In other cases, insufficient contact between a photomask and a photoresist precludes the pattern of the photomask from being correctly transferred to the photoresist, resulting in insufficient dimension control of the diameter of the contact holes. FIG. 43C shows that the contact holes 8a and 8b have excessively large diameters, for example.

If the contact holes are thus not positioned as designed, a short circuit occurs in a portion of the semiconductor device which should not be short-circuited. For example, as shown in FIGS. 43B and 43C, since the gate electrodes 4b are slightly exposed to the contact holes 8b, a short circuit occurs between the gate electrodes 4b and the source and drain regions when the contact holes 8b are filled with the conductive material for contact.

To avoid the above described problems, it is necessary to provide sufficient distances between interconnect lines and between gate electrodes relative to a photomask alignment error and a contact hole diameter dimension error. This, however, prevents further size reduction of semiconductor devices.

SUMMARY OF THE INVENTION

According to a first aspect of the present invention, a method of manufacturing a semiconductor device comprises the steps of: (a) forming a first insulation film on a first region of a surface of a semiconductor substrate to form an electrode on the first insulation film; (b) stacking an insulative stopper film and a mask layer including a first layer and a second layer in the order named on a resultant structure provided in the step (a); (c) opening the second layer in a self-aligned manner over the electrode; (d) changing a property of a surface of the first layer using the opened second layer as a mask to form a property-changed layer, with the first layer left unchanged in property under the property-changed layer; (e) selectively removing the first layer by etching using the property-changed layer as a mask; and (f) selectively removing the stopper film by etching using the first layer left in the step (e) as a mask.

Preferably, according to a second aspect of the present invention, in the method of the first aspect, the mask layer further includes a third layer on opposite side of the second layer from the first layer, the third layer being relatively thick on a recessed portion of a resultant structure provided in the step (b) and being relatively thin on a raised portion of the resultant structure provided in the step (b), and the step (c) comprises the steps of: (c-1) etching back the entire surface of the third layer to expose the second layer; and (c-2) selectively removing the second layer by etching using the third layer as a mask.

Preferably, according to a third aspect of the present invention, in the method of the first aspect, the step (c) comprises the step of (c-1) polishing a resultant structure provided in the step (b).

Preferably, according to a fourth aspect of the present invention, in the method of the first aspect, the step (a) comprises the step of (a-1) forming an isolation element raised from the surface of the semiconductor substrate in a second region of the surface of the semiconductor substrate to form an interconnect line on the isolation element, the second region being other than the first region of the surface of the semiconductor substrate, and the step (c) comprises the step of (c-1) opening the second layer in a self-aligned manner over the electrode and the interconnect line. The method further comprises the steps of: (g) forming a second insulation film on a resultant structure provided in the step (f); (h) performing first etching such that the etch rate of the stopper film equals the etch rate of the second insulation film, to completely remove the stopper film over the second region in its thickness direction, with the stopper film over the first region not completely removed in its thickness direction; and (i) performing second etching such that the etch rate of the second insulation film is higher than the etch rate of the stopper film, to expose the surface of the first region and the interconnect line.

Preferably, according to a fifth aspect of the present invention, in the method of the first aspect, the step (a) comprises the step of (a-1) forming an isolation element raised from the surface of the semiconductor substrate in a second region of the surface of the semiconductor substrate to form an interconnect line on the isolation element, the second region being other than the first region of the surface of the semiconductor substrate, and the step (c) comprises the step of (c-1) opening the second layer in a self-aligned manner over the electrode and the interconnect line. The method further comprises the steps of: (g) forming a second insulation film on a resultant structure provided in the step (f); and (h) selectively removing the second insulation film by etching to expose the surface of the first region and the interconnect line, wherein the etch rate of the first insulation film equals the etch rate of the second insulation film in the etching performed in the step (h), and wherein the thickness of the stopper film is greater than r/(1−r) times the sum of the thickness of the first insulation film and the thickness of the electrode where r is a ratio of the etch rate of the stopper film to the etch rate of the first insulation film in the etching performed in the step (h) and is less than 1.

Preferably, according to a sixth aspect of the present invention, in the method of the first aspect, the step (a) comprises the step of (a-1) forming an isolation element in a second region of the surface of the semiconductor substrate to form an interconnect line on the isolation element, the second region being other than the first region of the surface of the semiconductor substrate, and the step (c) comprises the step of (c-1) opening the second layer in a self-aligned manner over the electrode and the interconnect line. The method further comprises the steps of: (g) forming a second insulation film on a resultant structure provided in the step (f); and (h) selectively removing the second insulation film by etching separately over the first region and over the second region to expose the surface of the first region and the interconnect line.

Preferably, according to a seventh aspect of the present invention, in the method of the first aspect, the step (a) comprises the step of (a-1) forming an isolation element in a second region of the surface of the semiconductor substrate to form an interconnect line on the isolation element, the second region being other than the first region of the surface of the semiconductor substrate, and the step (c) comprises the step of (c-1) opening the second layer in a self-aligned manner over the electrode and the interconnect line. The method further comprises the step of (g) forming a mask covering the first region to remove the stopper film over the second region.

According to an eighth aspect of the present invention, a method of manufacturing a semiconductor device comprises the steps of: (a) preparing a semiconductor substrate having a surface divided into a first region and a second region; (b) stacking a first insulative material, a conductive material, and a stopper film in the order named on a resultant structure provided in the step (a); (c) selectively removing the first insulative material, the conductive material, and the stopper film to form a first multilayer structure including the first insulative material, the conductive material and the stopper film which are arranged in a stacked relation in the order named on the first region and a second multilayer structure including the first insulative material, the conductive material and the stopper film which are arranged in a stacked relation in the order named on the second region, the first and second multilayer structures being positioned in spaced apart relation with each other; and (d) reducing the thickness of the stopper film over the second region to a thickness less than the thickness of the stopper film over the first region.

Preferably, according to a ninth aspect of the present invention, in the method of the eighth aspect, the step (a) comprises the step of (a-1) forming an isolation element raised from the surface of the semiconductor substrate in the second region, the step (d) is performed after the step (c), and the step (d) comprises the steps of: (d-1) forming a second insulative material for filling space between the first and second multilayer structures; and (d-2) polishing a resultant structure provided in the step (d-1) to expose the first multilayer structure.

Preferably, according to a tenth aspect of the present invention, in the method of the eighth aspect, the step (a) comprises the step of (a-1) forming an isolation element raised from the surface of the semiconductor substrate in the second region, the step (d) is performed before the step (c), and the step (d) comprises the step of: (d-1) polishing a resultant structure provided in the step (b) from above the stopper film.

Preferably, according to an eleventh aspect of the present invention, in the method of the eighth aspect, the step (a) comprises the step of (a-1) forming an isolation element in the second region, the step (d) is performed after the step (c), and the step (d) comprises the steps of: (d-1) forming a mask covering only the first region; and (d-2) etching the stopper film using the mask.

Preferably, according to a twelfth aspect of the present invention, in the method of the eighth aspect, the step (a) comprises the step of (a-1) forming an isolation element in the second region, the step (d) is performed before the step (c), and the step (d) comprises the steps of: (d-1) forming a mask covering only the first region; and (d-2) etching the stopper film using the mask.

According to a thirteenth aspect of the present invention, a method of manufacturing a semiconductor device comprises the steps of: (a) forming a first insulation film on a surface of a semiconductor substrate to form an electrode on the first insulation film, with a second insulation film formed on the electrode; (b) forming a mask layer on a resultant structure provided in the step (a), the mask layer being relatively thick on a recessed portion of the resultant structure and being relatively thin on a raised portion of the resultant structure; (c) etching back the entire surface of the mask layer to expose the second insulation film, with the first insulation film covered with the mask layer; (d) reducing the width of the second insulation film to provide a stepped portion defined between the second insulation film and the electrode; (e) forming a third insulation film on a resultant structure provided in the step (d); and (f) etching back the entire surface of the third insulation film to leave parts of the third insulation film which cover the side faces of the electrode, part of the top surface of the electrode which is not covered with the second insulation film, and the side faces of the second insulation film.

The method of the first aspect of the present invention may correctly pattern the stopper film to provide a structure with the stopper film overlying the electrode if the use of the photolithographic technique makes difficult the precise alignment and dimension control of a photomask.

The method of the second aspect of the present invention forms the third layer which is relatively thin where the electrode is present, to expose the second layer only over the electrode, thereby opening the second layer only over the electrode.

The method of the third aspect of the present invention provides the second layer which is raised where the electrode is present, to open the second layer only over the electrode by polishing.

The method of the fourth aspect of the present invention may open the second insulation film to form contact holes which expose the surface of the first region, with the stopper film left, and which expose the interconnect line over the second region, with the stopper film removed.

The method of the fifth aspect of the present invention may provide the effect of the fourth aspect of the present invention only by one etching process.

The method of the sixth aspect of the present invention may reliably provide the effect of the fourth aspect of the present invention if the fourth and fifth aspects of the present invention are difficult to apply.

The method of the seventh aspect of the present invention uses the photomask adapted to form the isolation element to readily provide the effect of the fourth aspect of the present invention.

The method of the eighth aspect of the present invention may facilitate the step of exposing the conductive material in the second multilayer structure without exposing the conductive material in the first multilayer structure since the stopper film in the second multilayer structure is thinner than that in the first multilayer structure.

In the method of the ninth aspect of the present invention, since the isolation element is raised from the surface of the semiconductor substrate, polishing until the first multilayer structure is exposed removes the stopper film of the second multilayer structure by a greater amount than the stopper film of the first multilayer structure, accordingly reducing the thickness of the stopper film of the second multilayer structure.

In the method of the tenth aspect of the present invention, since the isolation element is raised from the surface of the semiconductor substrate, polishing from above the stopper film removes the stopper film of the second multilayer structure by a greater amount than the stopper film of the first multilayer structure, accordingly reducing the thickness of the stopper film of the second multilayer structure.

In the method of the eleventh and twelfth aspects of the present invention, the mask for use in the step (a-1) may be employed as the mask for use in the steps (d-1) and (d-2). This insures the reduction of the thickness of the stopper film of the second multilayer structure by a greater amount than that of the stopper film of the first multilayer structure without the increase in the number of required masks.

The method of the thirteenth aspect of the present invention may form the third insulation film which is thicker on the stepped portion than over the second insulation film to cover the top surface of the electrode in addition to the side faces thereof with the third insulation film.

It is therefore an object of the present invention to provide a technique for avoiding a short circuit in a semiconductor device without interfering with the size reduction thereof.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

First Preferred Embodiment

Figure 1A:
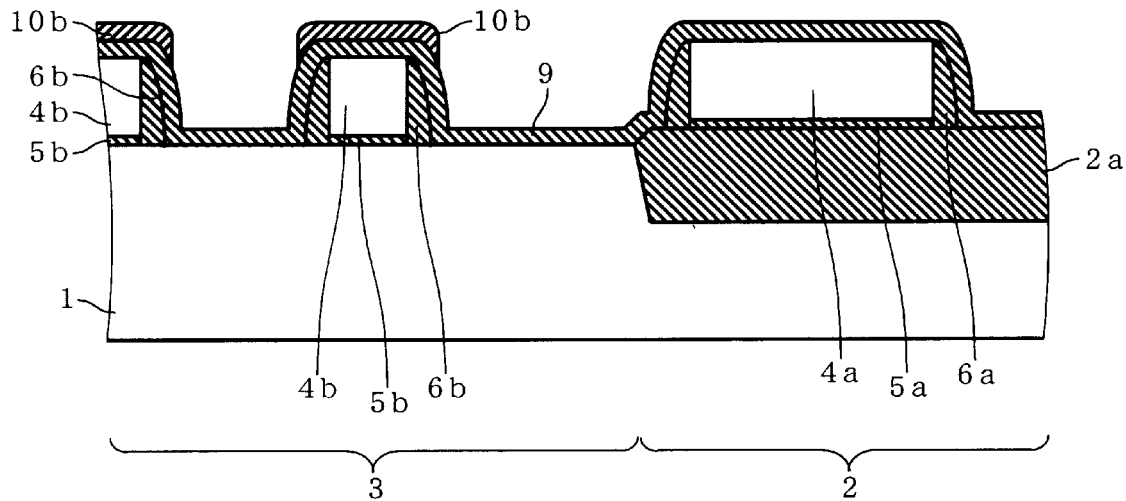
FIGS. 1A and 1B show a structure of a semiconductor device according to a first preferred embodiment of the present invention.

FIG. 1A shows a structure of a semiconductor device according to a first preferred embodiment of the present invention. Similar to the background art semiconductor device, the semiconductor device of the first preferred embodiment comprises a semiconductor substrate 1 having a surface divided into two regions: an element isolation region 2 and an active region 3. An isolation element 2a employing the LOCOS process or a trench is formed in the element isolation region 2. A gate insulation film 5a is formed on the surface of the isolation element 2a, and an interconnect line 4a is formed on the gate insulation film 5a. Sidewalls 6a are formed on the side faces of the interconnect line 4a. Gate insulation films 5b are formed on the surface of the active region 3, and gate electrodes 4b are formed on the respective gate insulation films 5b. Sidewalls 6b are formed on the side faces of each of the gate electrodes 4b. Source and drain regions which constitute a MOS element with each of the gate electrodes 4b are formed in the surface of the active region 3, but are not shown for purposes of simplicity.

An insulation film 9 is formed to cover the entire top surfaces of the interconnect line 4a, the gate electrodes 4b, the sidewalls 6a and 6b, and the semiconductor substrate 1. Insulative stopper films 10b are also formed on the top surfaces of parts of the insulation film 9 which cover the gate electrodes 4b and the sidewalls 6b.

Figure 1B:
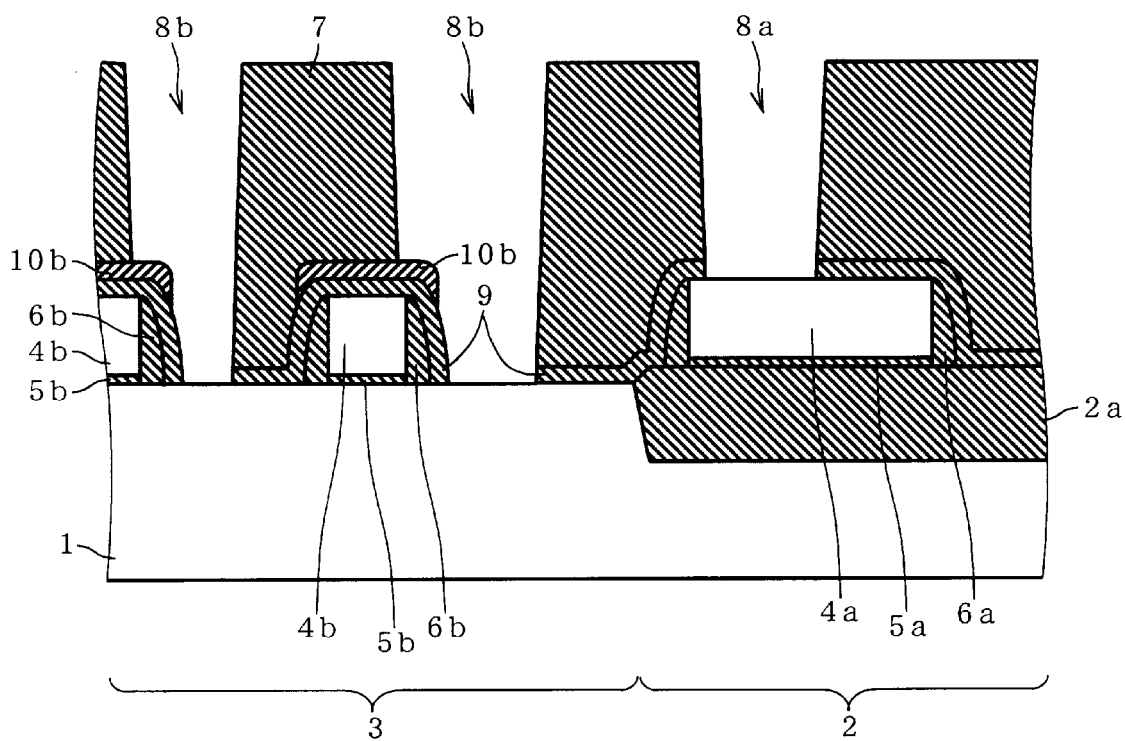
Figure 43A:
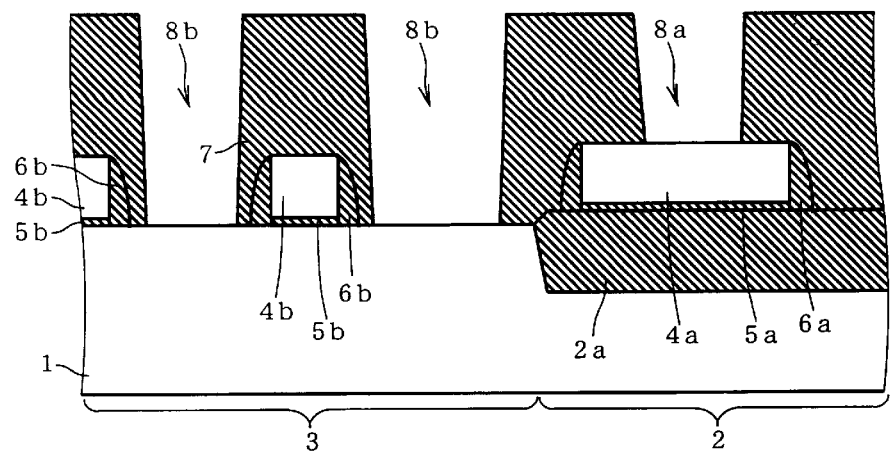
FIGS. 43A through 43C show the structure of a background art semiconductor device.
Figure 43B:
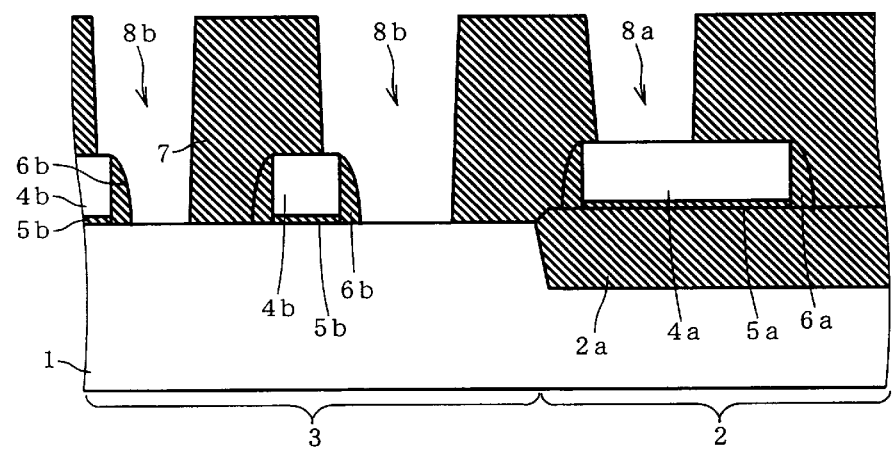
Figure 43C:
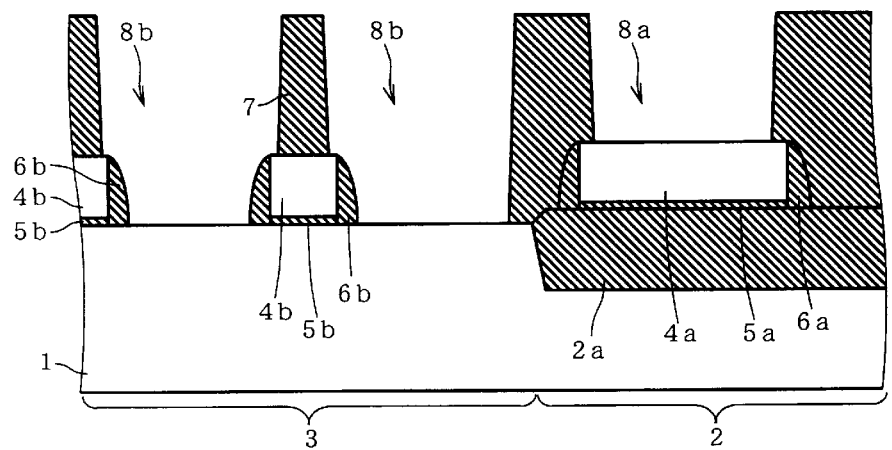

FIG. 1B shows the structure of the semiconductor device when, with an interlayer insulation film 7 once formed to cover the entire top surface of the structure shown in FIG. 1A, a contact hole 8a is formed therein over the element isolation region 2 for electrical connection to the interconnect line 4a whereas contact holes 8b are formed therein over the active region 3 for electrical connection to the source and drain regions not shown. In FIG. 1B, the contact holes 8a and 8b, similar to those of FIGS. 43B and 43C, are shown as not positioned as designed.

The stopper films 10b are selected so that etching conditions employed therefor includes an etch rate lower than that of the interlayer insulation film 7. For example, the use of a silicon oxide based material as the material of the interlayer insulation film 7 and silicon nitride as the material of the stopper films 10b allows the etch rate of the stopper films 10b to be lower than that of the interlayer insulation film 7 using the etching conditions known in the art.

By the use of such etching conditions, the stopper films 10b may be left after the formation of the contact holes 8b to function as a cover for preventing a short circuit between the gate electrodes 4b and the source and drain regions (not shown) if the contact holes 8b are not positioned as designed.

For the provision of the stopper films 10b only over the gate electrodes 4b and the sidewalls 6b, a stopper film 10b must be once formed to cover the entire top surface of the structure over the semiconductor substrate 1 and then selectively etched away. The insulation film 9 is provided under the stopper films 10b for the purpose of protecting the surface of the semiconductor substrate 1 from the etching of the stopper films 10b. As shown in FIG. 1B, it is desirable to remove the insulation film 9 in the contact holes 8a and 8b together with the interlayer insulation film 7 during the formation of the contact holes 8a and 8b. For this reason, the insulation film 9 is preferably made of a material similar to the material of the interlayer insulation film 7. For example, when a silicon oxide based material is used as the material of the interlayer insulation film 7, a non-doped silicate glass oxide film may be used as the insulation film 9.

The interconnect line 4a and the gate electrodes 4b may have a multilayer structure comprising, for example, low-resistance high-melting-point metal silicide formed on polysilicon (although the interconnect line 4 and the gate electrodes 4b are not shown as having a multilayer structure). This decreases the resistances of the interconnect line 4 and the gate electrodes 4b to prevent the deterioration of the characteristics of MOS elements including the source and drain regions (not shown) and the gate electrodes 4b.

Similarly, also in the active region 3, silicon may be used as the material of the semiconductor substrate 1, and parts of the semiconductor substrate 1 (in which the source and drain regions are to be formed) which face the contact holes 8b may have a multilayer structure comprising, for example, high-melting-point metal silicide formed on the silicon substrate surface (although the active region 3 is not shown as having a multilayer structure).

The use of the semiconductor device according to the first preferred embodiment solves the problem of the short circuit between the gate electrodes 4b and the active region 3 because of the presence of the stopper films 10b if the contact holes 8b are not positioned as designed due to an insufficient photomask alignment precision and insufficient contact hole diameter dimension controllability. This enables a shorter distance between the gate electrodes than that of the background art structure to prevent the interference with further size reduction of the semiconductor device. Furthermore, since the insulation film 9 and the interlayer insulation film 7 are made of similar materials, the interconnect line 4a and the gate electrodes 4b may be readily exposed to the contact holes 8a and 8b only by one etching process.

Second Preferred Embodiment

A second preferred embodiment according to the present invention illustrates a technique for forming the stopper films 10b in a self-aligned manner only over the gate electrodes 4b and the sidewalls 6b. This is effective in that the patterning of the stopper films 10b without the use of the photolithographic technique eliminates the need to increase the photomask alignment precision required during the formation of the photoresist.

Figure 2:
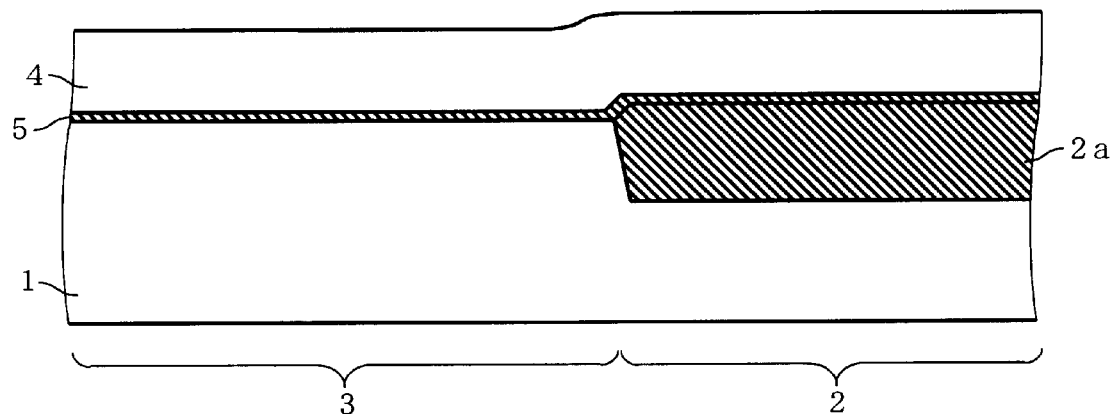
FIGS. 2 through 13 show respective steps of a method of manufacturing a semiconductor device according to a second preferred embodiment of the present invention.

First, the semiconductor substrate 1 is divided into the element isolation region 2 and the active region 3. The isolation element 2a is formed in the element isolation region 2. A multilayer structure comprising a gate insulation film 5 and a conductive material 4 for the interconnect line and the gate electrodes which are arranged in a stacked relation in the order named is formed to cover the entire top surface of the resultant structure (FIG. 2).

Figure 3:
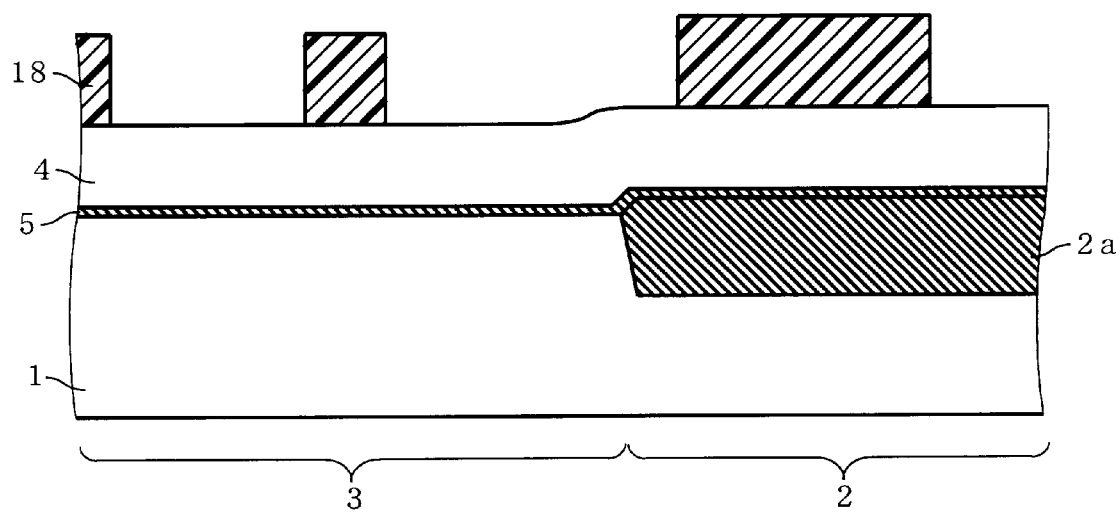
Figure 4:
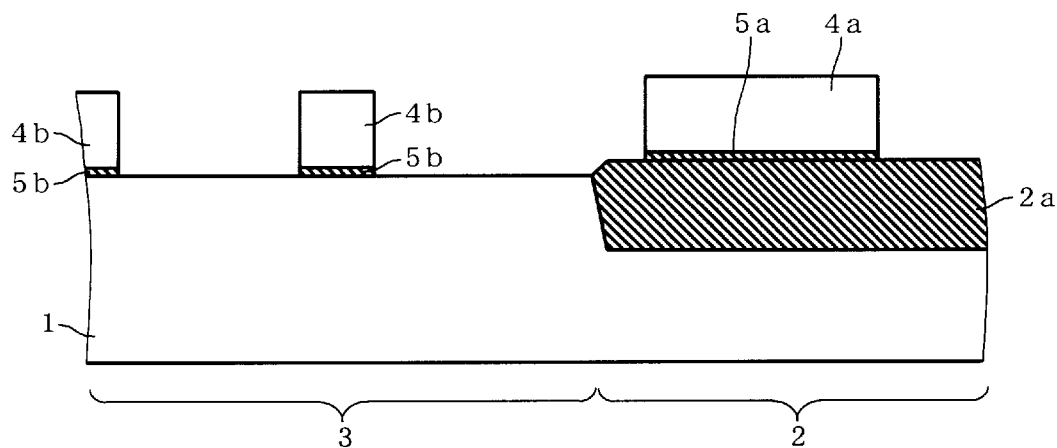

A photoresist 18 is applied to the top surface of the resultant structure and then patterned by the photolithographic technique (FIG. 3). The gate insulation film 5 and is the conductive material 4 are etched using the remaining photoresist 18 as a mask, to form the gate insulation films 5a and 5b, the gate electrodes 4b, and the interconnect line 4a (FIG. 4). Impurities are implanted into the active region 3 using the gate insulation films 5a and 5b, the gate electrodes 4b and the interconnect line 4a as a mask to form the source and drain regions (not shown).

Figure 5:
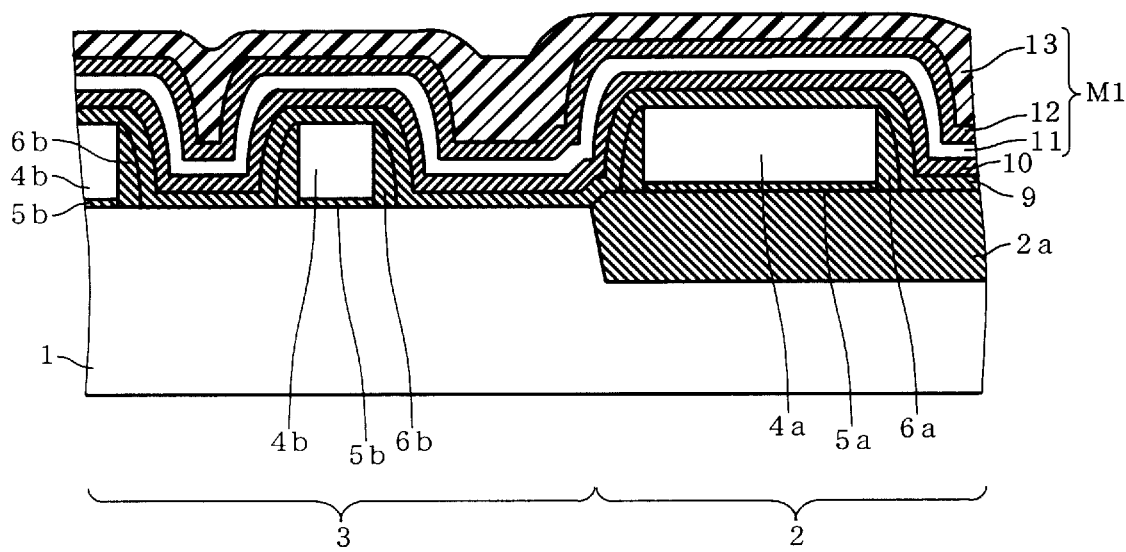

The sidewalls 6a are formed on opposite sides of the gate insulation film 5a and the interconnect line 4a, and the sidewalls 6b are formed on opposite sides of the gate insulation films 5b and the gate electrodes 4b. The above described process steps are similar to those of the background art method. In the second preferred embodiment, the insulation film 9, an insulative stopper film 10 and a mask layer M1 are formed in a stacked relation in the order named to cover the entire top surface of the resultant structure (FIG. 5).

The mask layer M1 functions to pattern the stopper film 10 in a self-aligned manner. When the silicon oxide based material, non-doped silicate glass oxide and silicon nitride are used, for example, as the materials of the interlayer insulation film 7, the insulation film 9 and the stopper film 10 respectively as illustrated in the first preferred embodiment, the mask layer M1 is comprised of three layers: a first layer 11 of polysilicon, a second layer 12 of silicon nitride, and a third layer 13 of an organic material. The mask layer M1 may be made of any number of layers which may pattern the stopper film 10.

Figure 6:
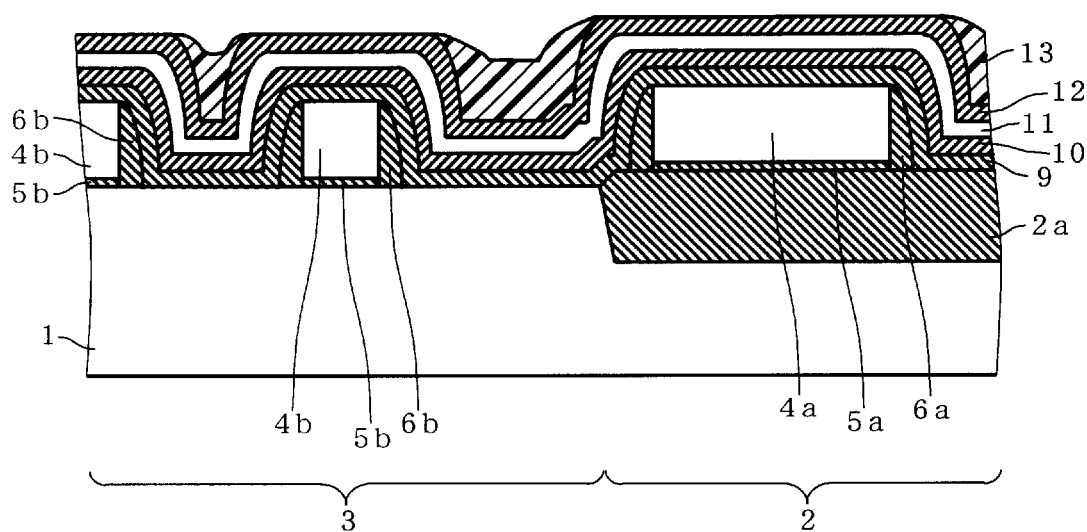

Since the organic material has good step coverage, the third layer 13 is deposited thick in a region lying between the interconnect line 4a, the gate electrodes 4b and the sidewalls 6a and 6b, and is deposited thin over the interconnect line 4a, the gate electrodes 4b and the sidewalls 6a and 6b. Thus, when the third layer 13 is etched back, the second layer 12 over the interconnect line 4a, the gate electrodes 4b and the sidewalls 6a and 6b may be exposed whereas the third layer 13 is left in the region lying between the interconnect line 4a, the gate electrodes 4b and the sidewalls 6a and 6b (FIG. 6).

Figure 7:
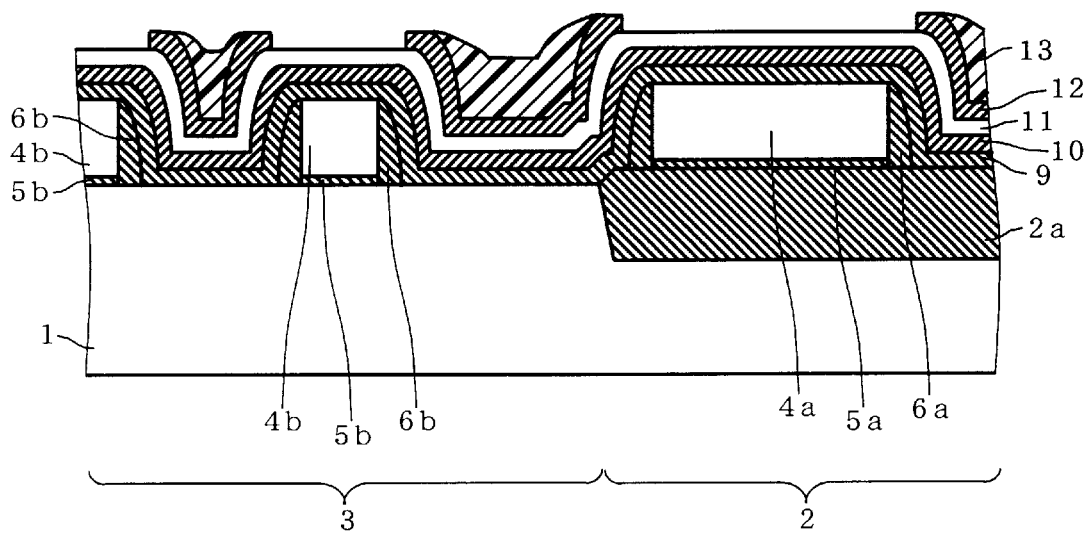
Figure 8:
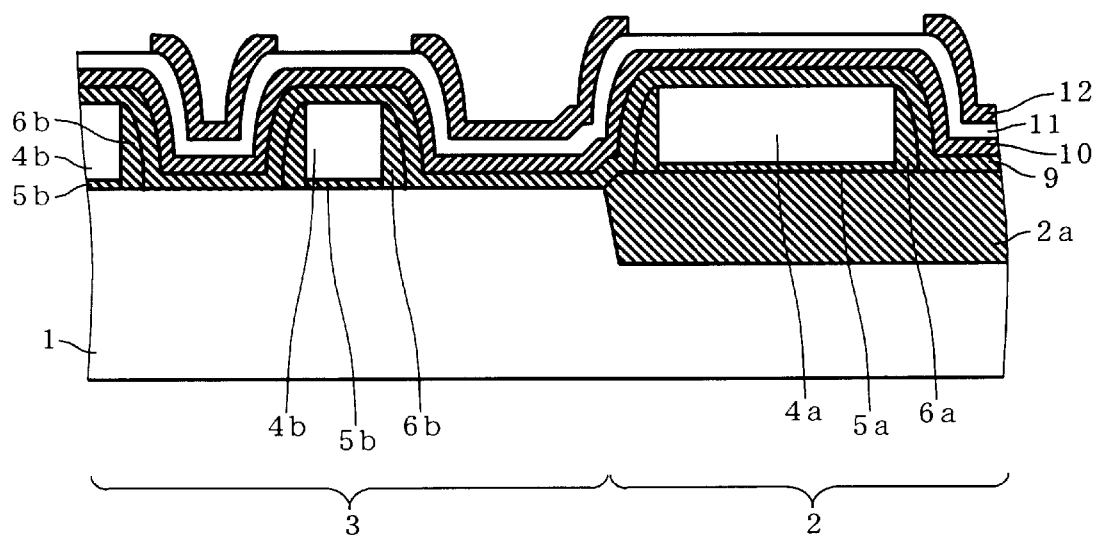

The second layer 12 is etched using the remaining third layer 13 as a mask to expose the first layer 11 only over the interconnect line 4a, the gate electrodes 4b and the sidewalls 6a and 6b (FIG. 7). Thereafter, the third layer 13 is removed (FIG. 8).

Figure 9:
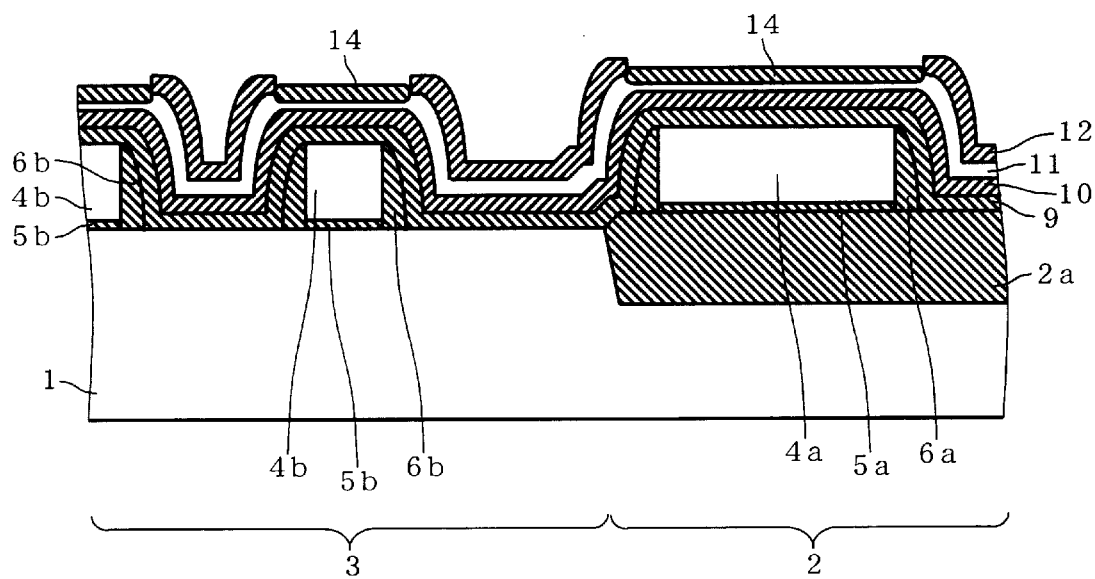
Figure 10:
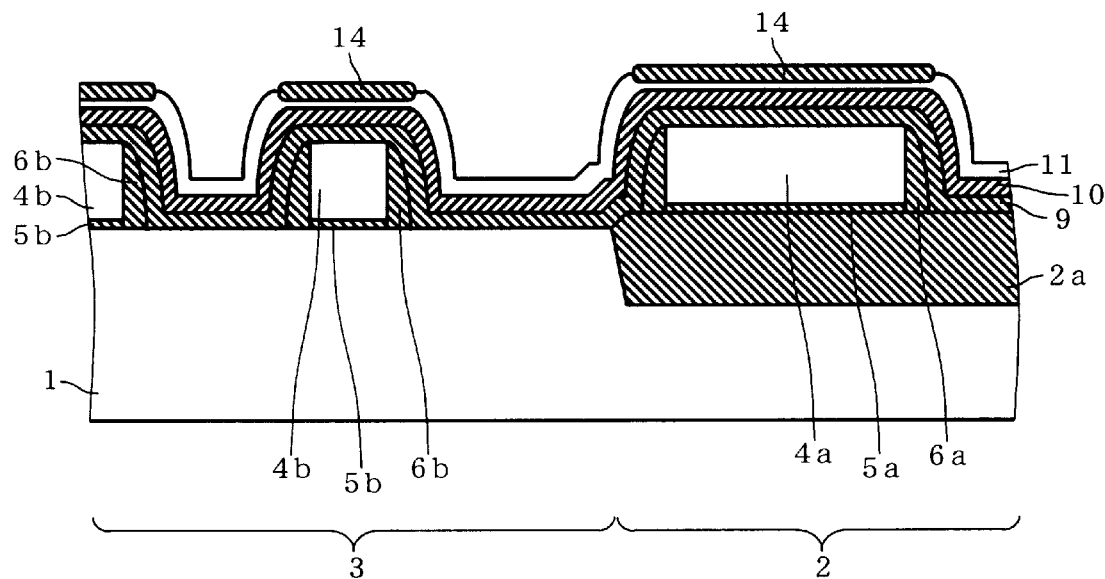
Figure 11:
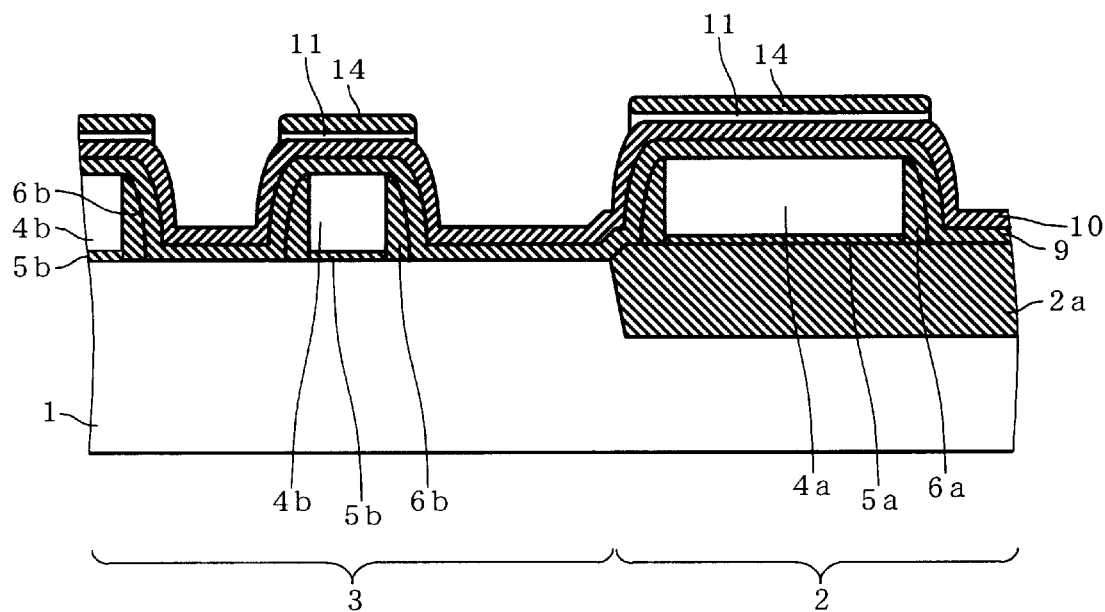

Then, the exposed first layer 11 is thermally oxidized to form polysilicon oxide films 14 in the surface thereof. In this thermal oxidation process, unoxidized parts of the first layer 11 are left under the polysilicon oxide films 14 (FIG. 9). Then the second layer 12 is removed by wet etching using phosphoric acid at elevated temperatures and the like (FIG. 10). Using the polysilicon oxide films 14 as a mask, the first layer 11 is dry etched so as to be left only under the polysilicon oxide films 14, that is, over the interconnect line 4a, the gate electrodes 4b and the sidewalls 6a and 6b (FIG. 11).

Figure 12:
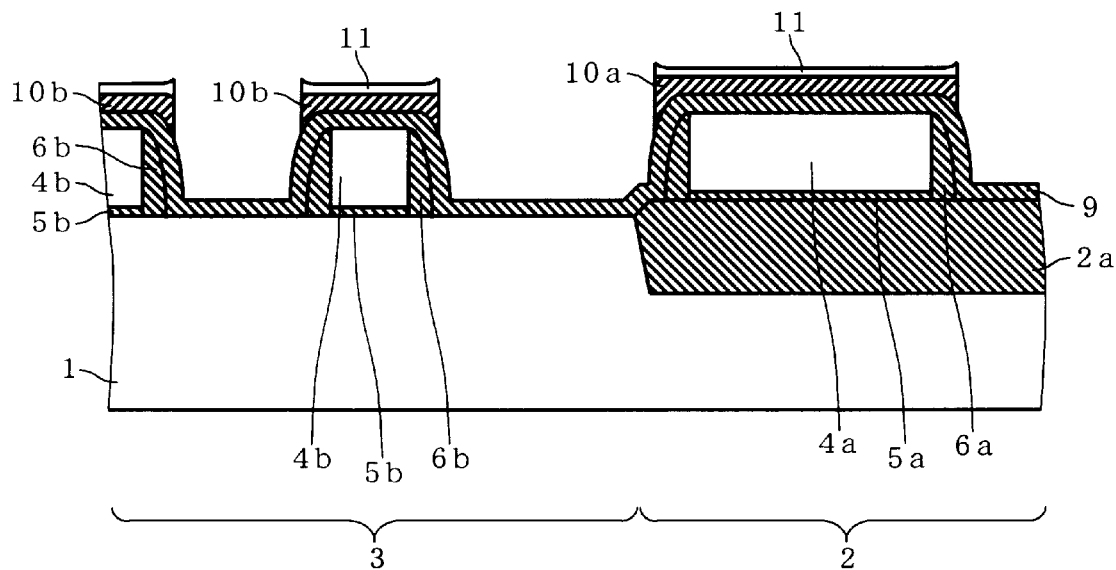
Figure 13:
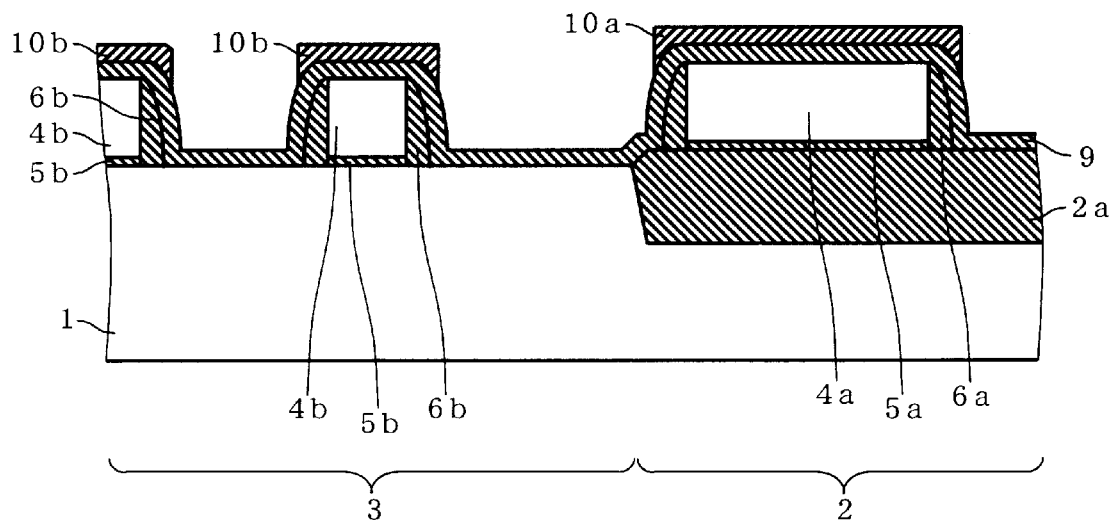

The stopper film 10 is dry etched using the remaining polysilicon oxide films 14 and the remaining unoxidized parts of the first layer 11 as a mask. At this time, the etch rate of polysilicon may be made lower than the etch rates of silicon nitride and polysilicon oxide by using the etching conditions known in the art. Thus, the polysilicon oxide films 14 and the stopper film 10 are etched to form a stopper film 10a over the interconnect line 4a and the sidewalls 6a, and the stopper films 10b over the gate electrodes 4b and the sidewalls 6b, with the first layer 11 placed on each of the stopper films 10a and 10b (FIG. 12). The remaining first layer 11 is removed by etching (FIG. 13). As described also in the first preferred embodiment, the oxide film 9 formed to cover the entire top surface of the semiconductor device protects the surface of the active region 3 from damages resulting from the dry etching before and after the completion of the removal of the stopper film 10.

The materials used for the first layer 11, the second layer 12 and the third layer 13 are not limited to those described above. The required characteristics of the first layer 11 are the capability of functioning as a mask against the etching of the stopper film 10 (See FIG. 12), the capability of being removed without the etching of the stopper film 10 (See FIG. 13), and the capability of being locally changed in property (oxidized herein) to function as a mask against the etching of the material which has not yet been changed in property (See FIG. 11). Polysilicon is preferred as the material of the first layer 11 because of the etch selectivity thereof to polysilicon oxide provided by the oxidation thereof and to silicon nitride which is the material of the stopper film 10.

The required characteristics of the second layer 12 are the capability of functioning as a mask for the first layer 11 against the above described property change (See FIGS. 8 and 9), and the capability of being removed without the etching of the first layer 11 and the property-changed material thereof (the polysilicon oxide films 14 herein) (See FIG. 10). Silicon nitride is preferred as the material of the second layer 12 because of the function thereof as a mask against oxidation and the etch selectivity thereof to polysilicon and polysilicon oxide.

The required characteristics of the third layer 13 are the capability of functioning as a mask against the etching of the second layer 12 (See FIGS. 6 and 7), the capability of being removed without the etching of the second layer 12 (See FIGS. 6 and 8), and good step coverage (See FIGS. 5 and 6). Organic materials are preferred as the material of the third layer 13 because of the etch selectivity thereof to silicon nitride and the good step coverage thereof. An example of such organic materials includes an organic anti-reflection coat. The organic anti-reflection coat is generally placed under a resist to prevent the influence of light reflected from uneven parts of the substrate surface upon the formation of the resist, and is advantageous in being easy to enter a recess.

Alternatively, for the thermal oxidation of the first layer 11 of polysilicon into a desired pattern for the purpose of patterning the stopper film 10, the third layer 13 made of an organic material may be formed directly on the surface of the first layer 11, with the formation of the second layer 12 dispensed with.

However, the organic material of the third layer 13 might melt if exposed to high temperatures during the thermal oxidation. In such a case, the organic material of the third layer 13 loses its function as a mask and yet becomes a source of contamination. It is hence desirable to provide the second layer made of silicon nitride as a mask against oxidation.

As above described, the method of manufacturing the semiconductor device according to the second preferred embodiment may precisely form the stopper films 10b over the gate electrodes 4b without the need to increase the photomask alignment precision because of the non-use of the photolithographic technique.

Third Preferred Embodiment

Figure 14A:
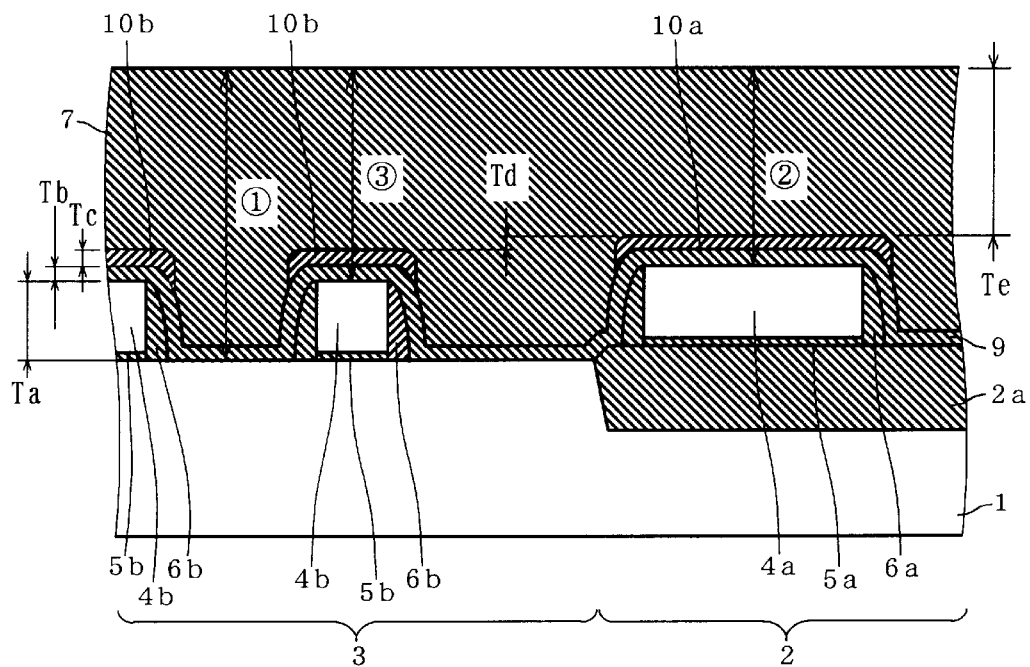
FIGS. 14A and 14B show respective steps of the method according to a third preferred embodiment of the present invention.

FIG. 14A shows the step of forming the interlayer insulation film 7 to cover the entire top surface of the structure of FIG. 13 in the method of the second preferred embodiment and planarizing the surface of the interlayer insulation film 7 by the CMP process.

Figure 14B:
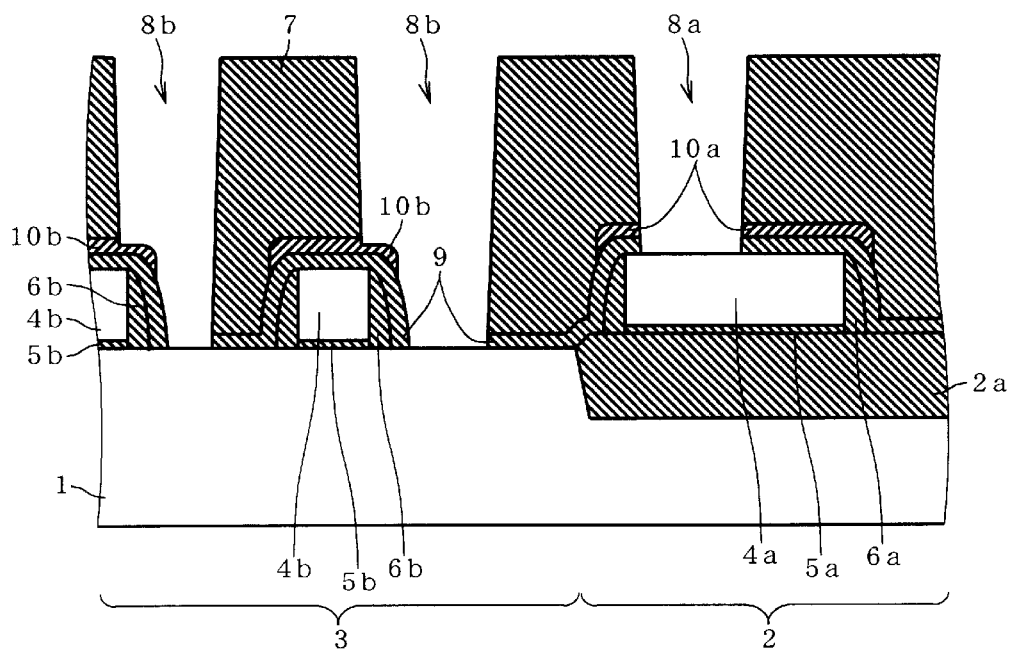

Then, a photoresist is formed using a photomask, and the contact holes 8a and 8b are formed using the photoresist (FIG. 14B). At this time, the formation of the contact holes may be controlled so that one etching process exposes the interconnect line 4a to the contact hole 8a but does not expose the gate electrodes 4b to the contact holes 8b if the conditions to be described hereinafter are satisfied.

As shown in FIG. 14A, the reference character Ta designates the sum of the thickness of the gate insulation films 5b and the thickness of the gate electrodes 4b; Tb designates the thickness of the oxide film 9; Tc designates the thickness of the stopper films 10a and 10b; Td designates a difference in level between the top surface of the stopper films 10b over the active region 3 and the top surface of the stopper film 10a over the element isolation region 2; and Te designates the thickness of the interlayer insulation film 7 covering the stopper film 10a over the element isolation region 2. Since the gate insulation films 5a and 5b are formed from the gate insulation film 5 and the interconnect line 4a and the gate electrodes 4b are formed from the conductive material 4 as illustrated in FIGS. 2 through 4 in the second preferred embodiment, the sum of the thickness of the gate insulation film 5a and the thickness of the interconnect line 4a is also represented by Ta. Thus, a difference in level between the surface of the active region 3 and the surface of the isolation element 2a is also represented by Td.

Over the active region 3, the thickness of the silicon oxide based material in a position ① wherein the gate electrodes 4b and the sidewalls 6b are not formed is the sum of the thickness of the interlayer insulation film 7 and the thickness of the insulation film 9 and is expressed by Ta+Tb+Tc+Td+Te. Over the element isolation region 2, the stopper film 10a having the thickness Tc and the silicon oxide based material having the thickness Tb+Te are present in a position ② on the interconnect line 4a. Also over the active region 3, the stopper film 10b having the thickness Tc and the silicon oxide based material having the thickness Tb+Te are present in a position ③ on the gate electrode 4b.

On the same etching conditions, the film thicknesses in the positions ② and ③ in terms of the thickness of the silicon oxide based material are Tb+Tc/r+Te and Tb+Tc/r+Td+Te, respectively, where r is the ratio of the etch rate of silicon nitride to the etch rate of the silicon oxide based material (where r is adjusted to satisfy 0<r<1). In order that one etching process does not expose the gate electrodes 4b to the contact holes 8b but exposes the interconnect line 4a to the contact hole 8a and exposes the active region 3 to the contact holes 8b, the etch rate ratio r and the film thicknesses Ta, Tc and Td should be determined to satisfy $$Ta + Tb + Tc + Td + Te < Tb + \frac{Tc}{r} + Td + Te \quad (1)$$

$$Tb + \frac{Tc}{r} + Te < Tb + \frac{Tc}{r} + Td + Te$$

That is, (2)

$$\frac{r}{1-r}Ta < Tc$$

$$Td > 0$$

The method of the third preferred embodiment may form the contact holes so that one etching process leaves the stopper films 10b over the active region 3 and completely etches the stopper film 10a over the element isolation region 2.

Fourth Preferred Embodiment

Figure 15A:
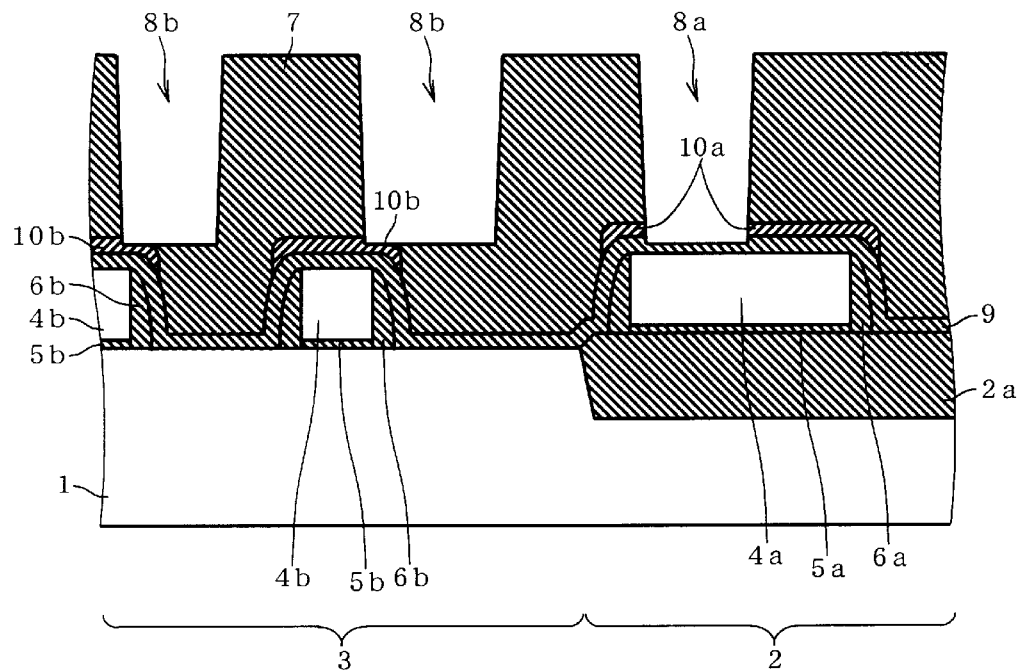
FIGS. 15A and 15B show respective steps of the method according to a fourth preferred embodiment of the present invention.

The contact holes 8a and 8b are formed by etching using the photolithographic technique in the structure shown in FIG. 14A in the method of the third preferred embodiment. The etching is suspended when the stopper film 10a is completely removed under the contact hole 8a but the stopper films 10b are not completely removed under the contact holes 8b (FIG. 15A). The etching conditions employed for this etching process may include a low etch selectivity between the stopper films 10a, 10b and the interlayer insulation film 7. For example, the above etching conditions may be readily established by using a silicon oxide based material as the material of the interlayer insulation film 7 and silicon nitride as the material of the stopper films 10a and 10b.

Figure 15B:
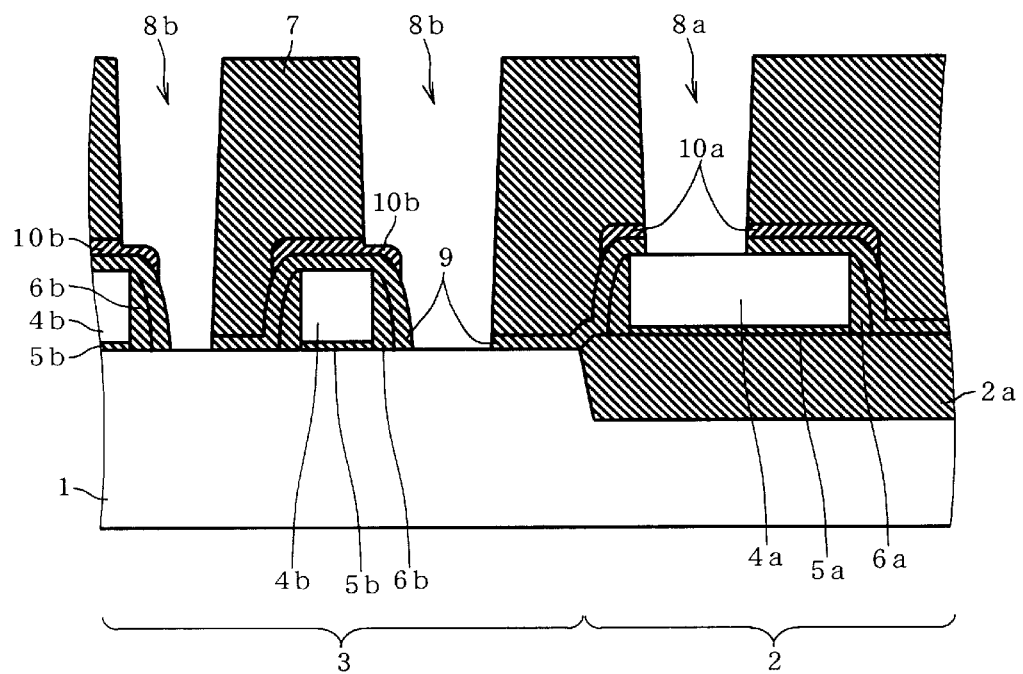

Then, etching is performed on such conditions that the ratio of the etch rate of the stopper films 10a and 10b to the etch rate of the interlayer insulation film 7 is less than 1. This allows the surface of the active region 3 to be exposed to the contact holes 8b while the interconnect line 4a is exposed to the contact hole 8a over the element isolation region 2 but the gate electrodes 4b are not exposed because of the function of the stopper films 10b over the active region 3 (FIG. 15B). It is desirable that the ratio of the etch rate of the interconnect line 4a to the etch rate of the interlayer insulation film 7 is less than 1 so that the interconnect line 4a is difficult to etch. For example, the silicon oxide based material may be used as the material of the interlayer insulation film 7 and polysilicon be used as the material of the interconnect line 4a.

The method of the fourth preferred embodiment may leave the stopper films 10b in the contact holes 8b over the active region 3 and remove the stopper film 10a in the contact hole 8a over the element isolation region 2 to expose the interconnect line 4a.

Fifth Preferred Embodiment

Figure 16A:
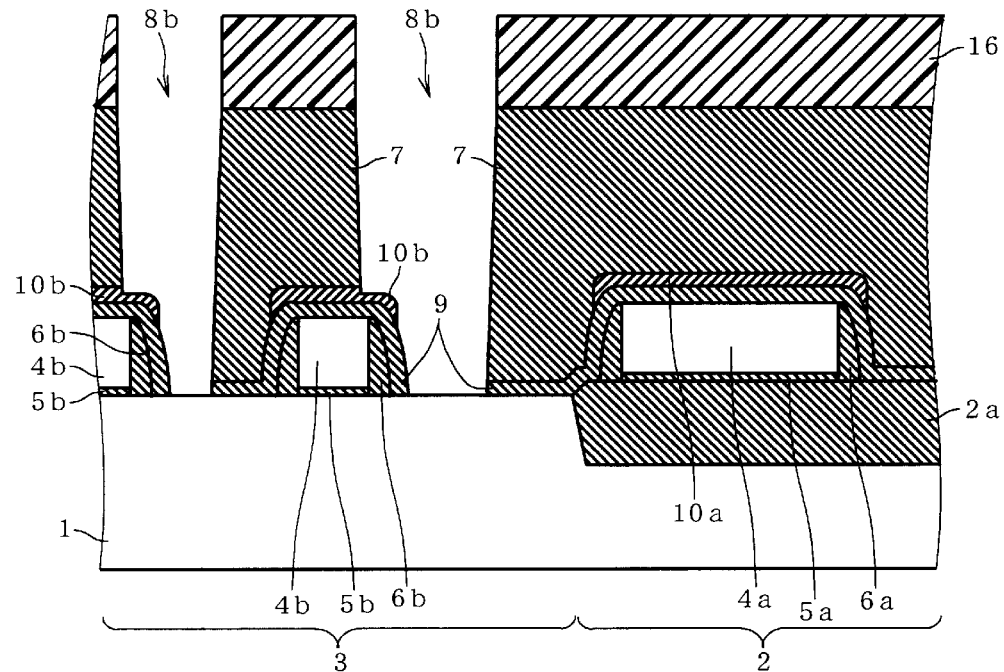
FIGS. 16A and 16B show respective steps of the method according to a fifth preferred embodiment of the present invention.

Unlike the third and fourth preferred embodiments, a fifth preferred embodiment according to the present invention comprises the step of forming the contact hole 8a and the step of forming the contact holes 8b separately. First, the structure of the third preferred embodiment shown in FIG. 14A is provided. Then, a photoresist 16 is formed using a photomask (not shown) for the formation of the contact holes 8b, and the contact holes 8b are formed by etching using the photoresist 16 as a mask (FIG. 16A). This etching is performed on the conditions that the ratio of the etch rate of the stopper films 10b to the etch rate of the interlayer insulation film 7 is less than 1. This allows the surface of the active region 3 to be exposed to the contact holes 8b, with the stopper films 10b left so as not to expose the gate electrodes 4b, if the contact holes 8b are shifted from their proper position.

Figure 16B:
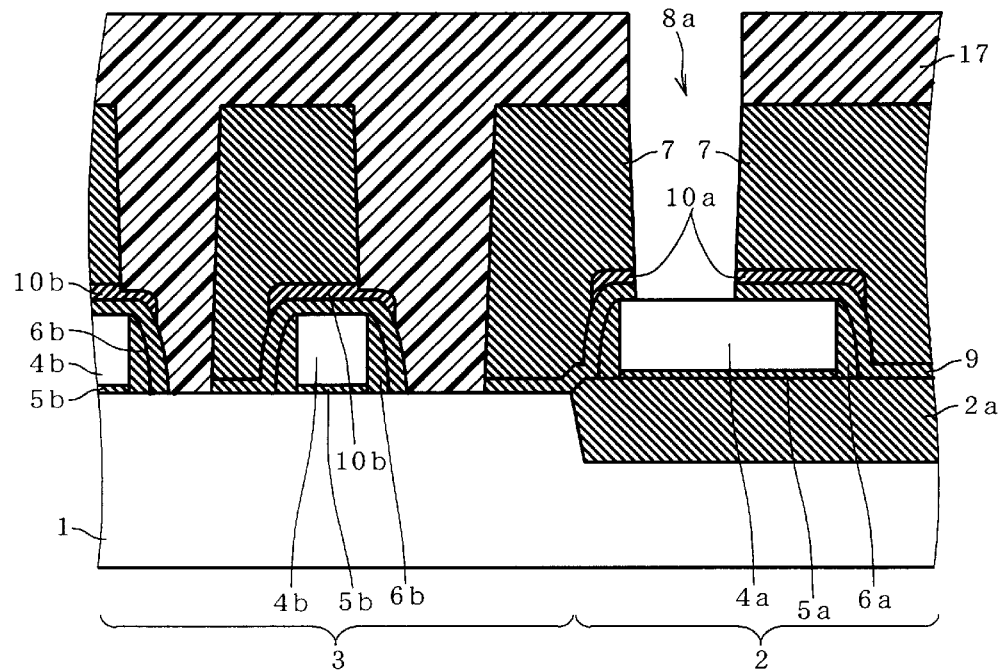

Next, a photoresist 17 is formed using a photomask (not shown) for the formation of the contact hole 8a, and the contact hole 8a is formed by etching using the photoresist 17 as a mask (FIG. 16B). In this etching process, the etch rate of the stopper film 10a may be approximately equal to the etch rate of the interlayer insulation film 7. Since the contact holes 8b are covered with the photoresist 17 and the width of the interconnect line 4a is generally greater than that of the gate electrodes 4b, the allowable position shift of the contact hole 8a is greater than that of the contact holes 8b, and the stopper film 10a may be completely removed in the contact hole 8a.

The method of the fifth preferred embodiment may reliably leave the stopper films 10b over the active region 3 and form the contact hole over the element isolation region 2 so that the stopper film 10a is completely etched away therein if it is difficult to employ the method of the third preferred embodiment wherein the conditions of the etch rate ratio and the film thicknesses are adjusted and the method of the fourth preferred embodiment wherein the etching time is controlled.

Sixth Preferred Embodiment

Figure 17A:
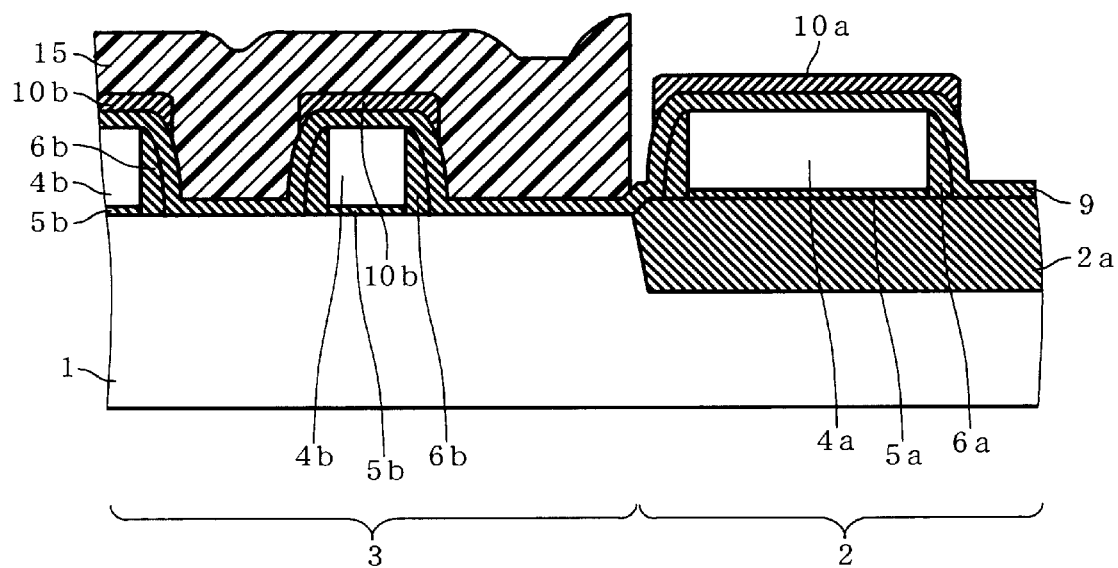
FIGS. 17A and 17B show respective steps of the method according to a sixth preferred embodiment of the present invention.

The structure shown in FIG. 13 in the method of the second preferred embodiment is prepared. A photoresist 15 is formed only over the active region 3 (FIG. 17A). A photomask for use in the formation of the isolation element 2a may be used to form the photoresist 15. The formation of the photoresist 15 uses the photolithographic technique which presents the problems of the alignment error and dimension error. However, since the photoresist 15 is required only to cover the stopper films 10b but need not cover the stopper film 10a, the above-mentioned problems may be avoided by designing the semiconductor device so that the interconnect line 4a and the gate electrodes 4b are not positioned adjacent to the boundary between the active region 3 and the element isolation region 2 in consideration for the errors.

Figure 17B:
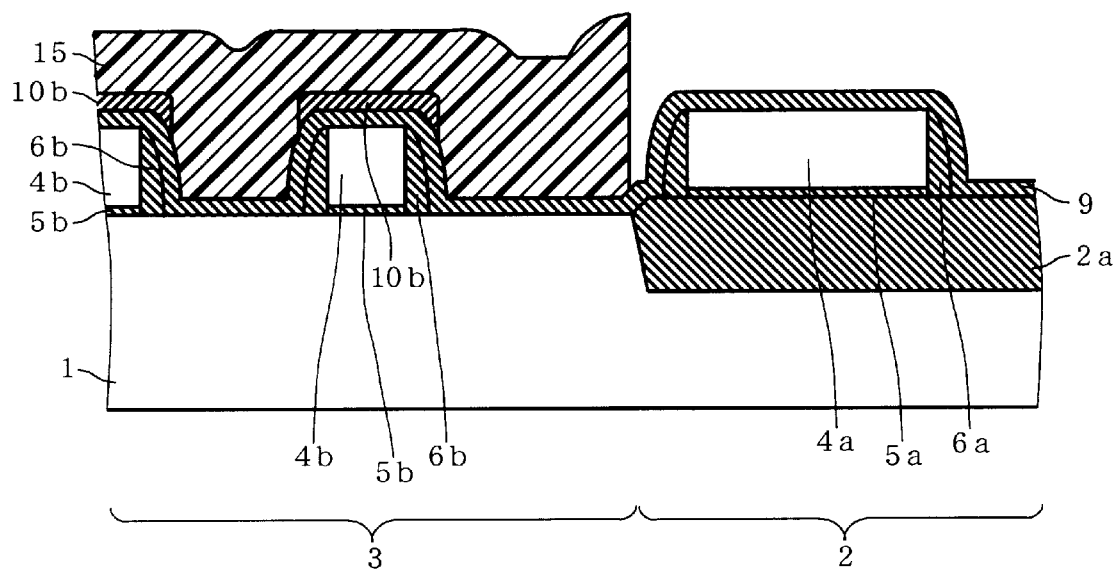

The stopper film 10a is removed by etching using the photoresist 15 as a mask (FIG. 17B). Thereafter, the photoresist 15 is removed. This provides the structure shown in FIG. 1A.

The method of the sixth preferred embodiment may make it possible to readily manufacture the semiconductor device shown in FIG. 1A using the existing photomask without the increase in the number of required photomasks.

Seventh Preferred Embodiment

Figure 18:
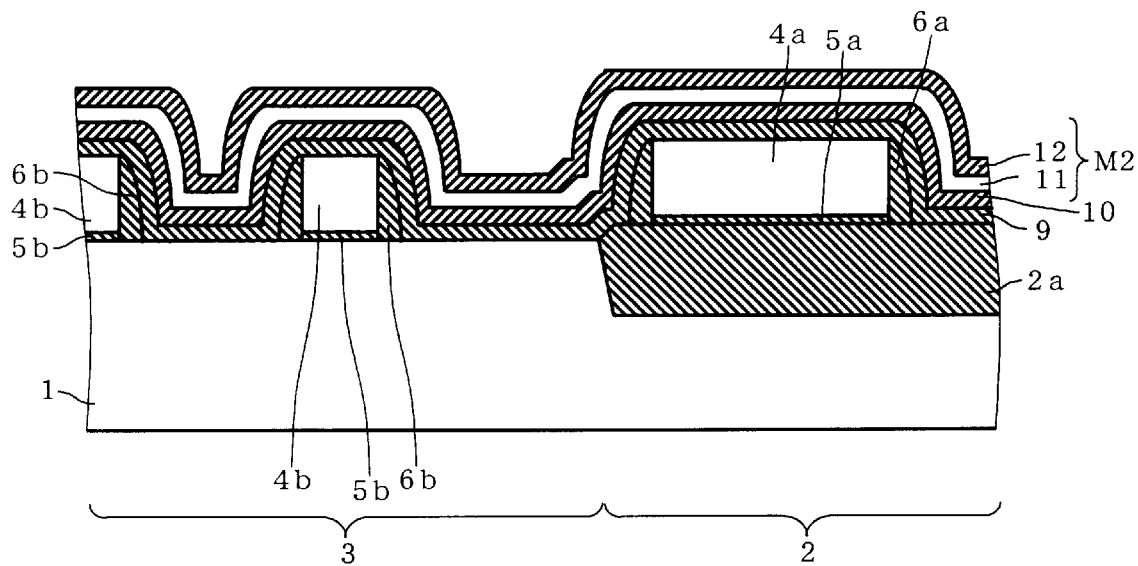
FIGS. 18 through 24 show respective steps of the method according to a seventh preferred embodiment of the present invention.

The semiconductor substrate 1 is divided into the element isolation region 2 and the active region 3, and the isolation element 2a, the gate insulation films 5a and 5b, the gate electrodes 4b, the interconnect line 4a and the sidewalls 6a and 6b are formed in a manner described in the second preferred embodiment. The oxide film 9, the stopper film 10 and a mask layer M2 are formed in a stacked relation in the order named to cover the entire top surface of the resultant structure (FIG. 18). A seventh preferred embodiment according to the present invention differs from the second preferred embodiment in that the mask layer M2 is comprised of two layers: the first layer 11 and the second layer 12. The first layer 11 is made of polysilicon and the second layer 12 is made of silicon nitride, for example.

Figure 19:
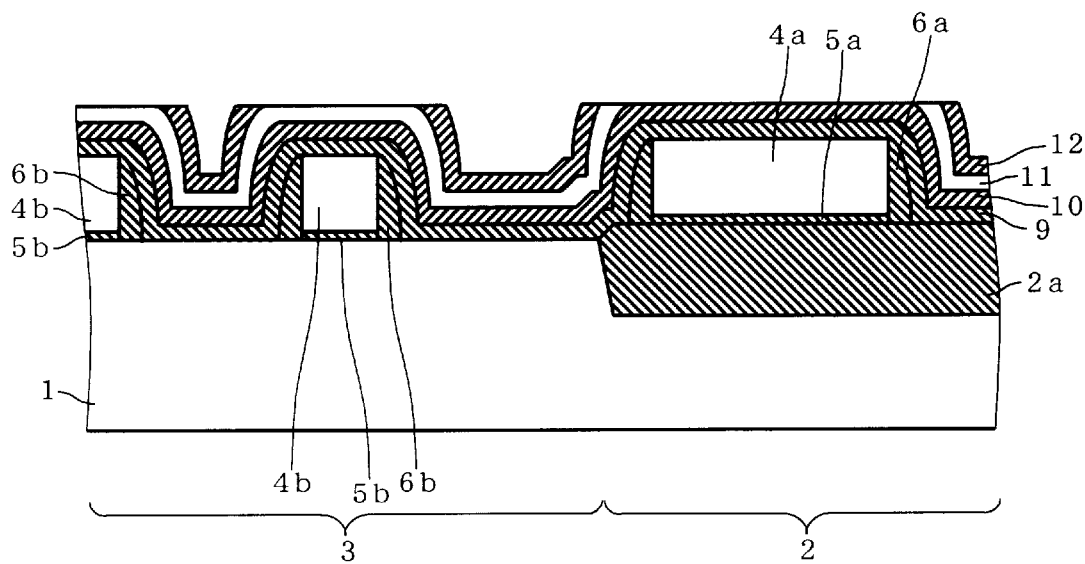
Figure 20:
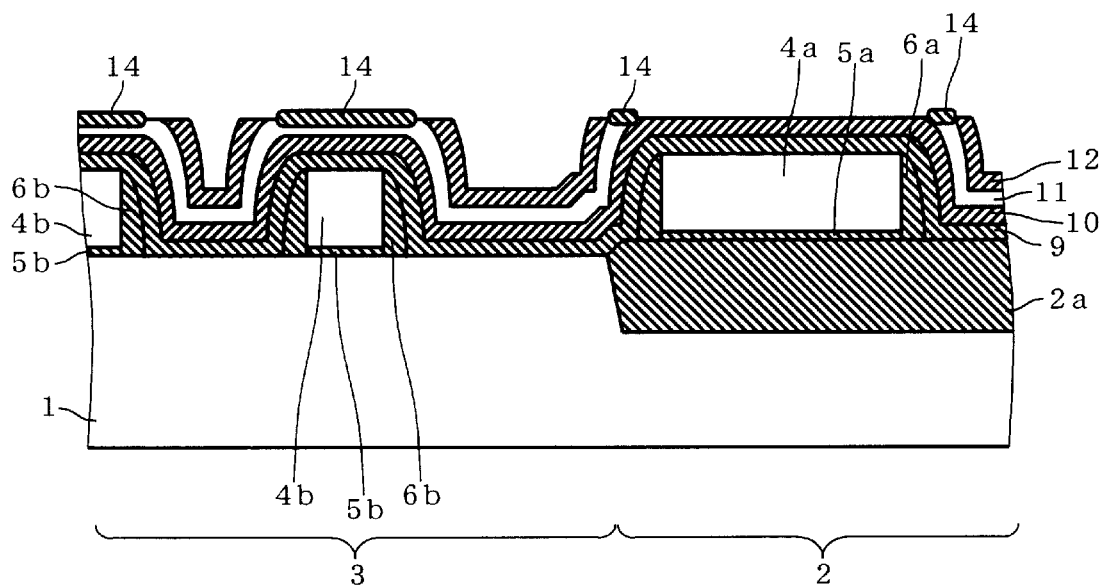
Figure 21:
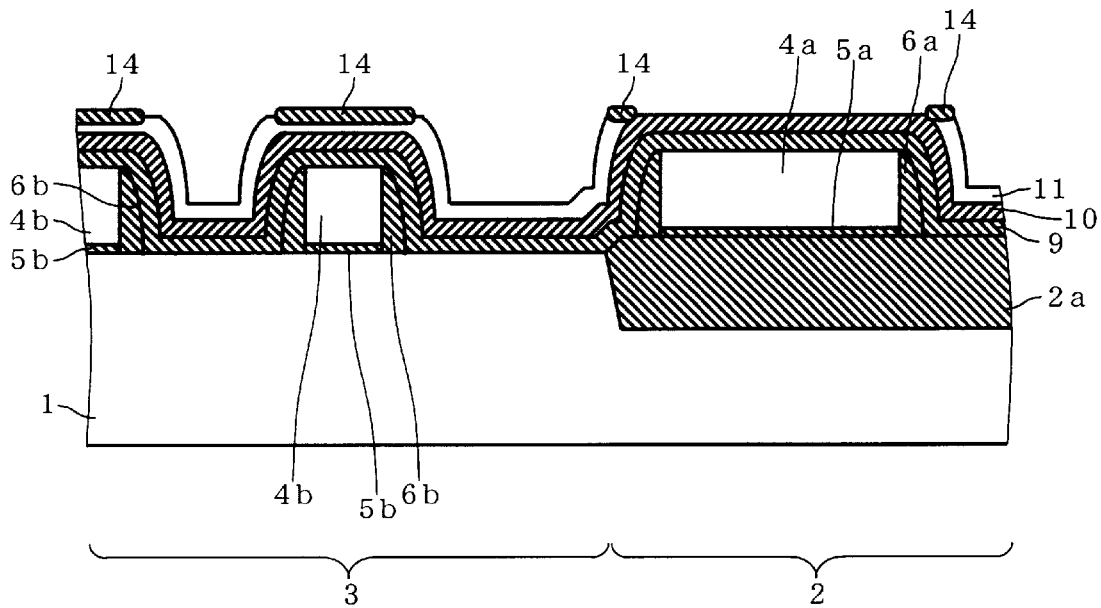

Then, the surface of the structure of FIG. 18 is polished by the CMP process until the first layer 11 is exposed over the active region 3 and the stopper film 10 is exposed over the element isolation region 2 by utilizing the level difference between the active region 3 and the element isolation region 2 (FIG. 19). Thermal oxidation is performed using the stopper film 10 and the second layer 12 both made of silicon nitride as a mask to form the polysilicon oxide films 14 in the exposed surface parts of the first layer 11. In this thermal oxidation process, unoxidized parts of the first layer 11 are left under the polysilicon oxide films 14 over the active region 3 (FIG. 20). The second layer 12 is wet etched using phosphoric acid at elevated temperatures and the like (FIG. 21).

Figure 22:
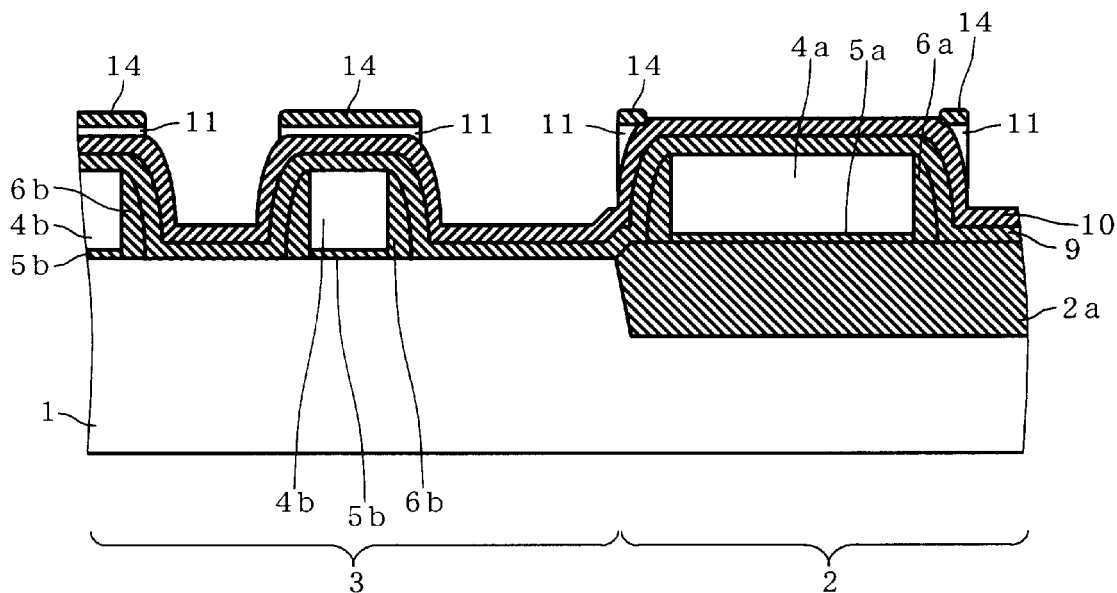
Figure 23:
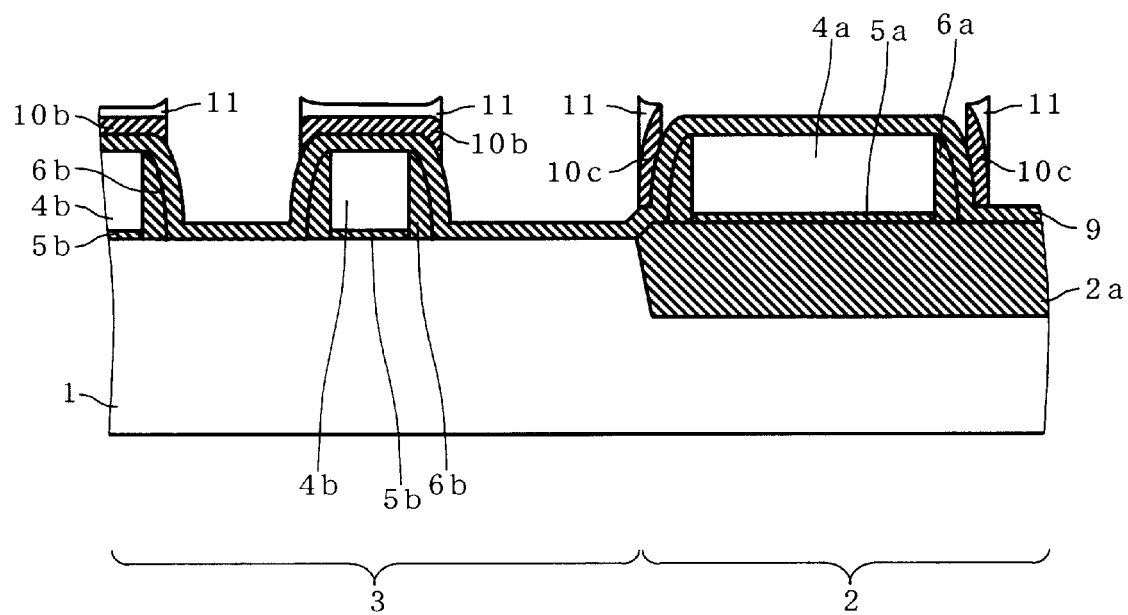
Figure 24:
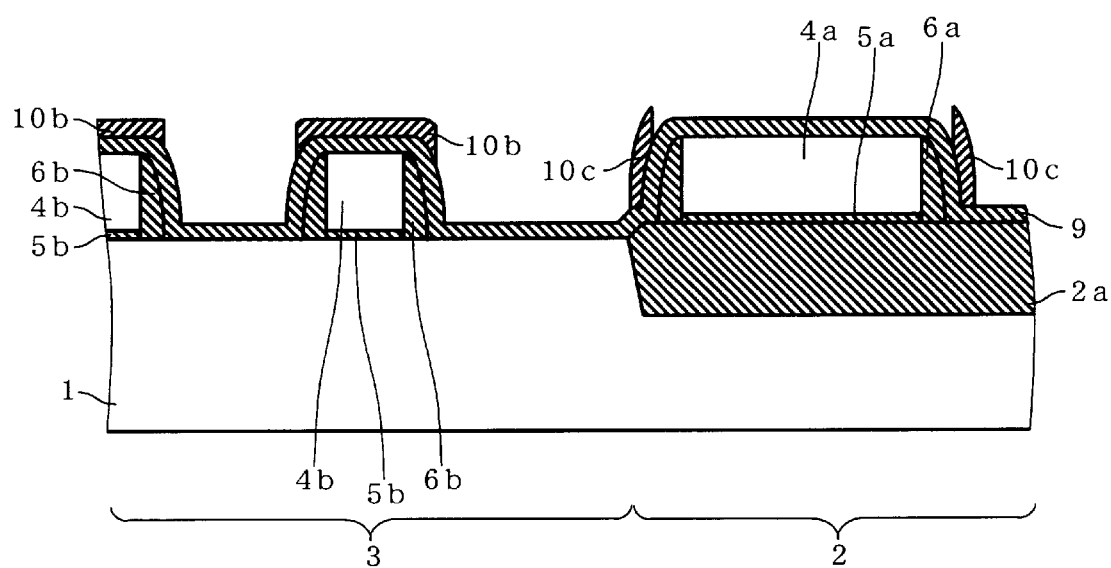

The first layer 11 is dry etched using the polysilicon oxide films 14 as a mask (FIG. 22). The stopper film 10 is dry etched using the remaining unoxidized parts of the first layer 11 as a mask. As illustrated also in the second preferred embodiment, the polysilicon oxide films 14 are removed by etching at the same time as the stopper film 10 (FIG. 23). The remaining parts of the first layer 11 are removed by etching (FIG. 24). The insulation film 9 protects the surface of the active region 3 from the damages resulting from these etching processes, as described also in the first preferred embodiment.

In this manner, the stopper films 10b are formed only over the gate electrodes 4b whereas the stopper film 10a is not formed over the interconnect line 4a. Stopper films 10c are left beside the sidewalls 6a, with the insulation film 9 therebetween, over the element isolation region 2. However, the stopper films 10c do not prevent the interconnect line 4a from being exposed in the steps illustrated in the third to sixth preferred embodiments, and therefore do not impair the effects of the present invention.

The method of the seventh preferred embodiment which does not employ the photolithographic technique may precisely form the stopper films 10b over the gate electrodes 4b without the need to increase the photomask alignment precision, manufacturing the semiconductor device shown in FIG. 1A.

Eighth Preferred Embodiment

Figure 25A:
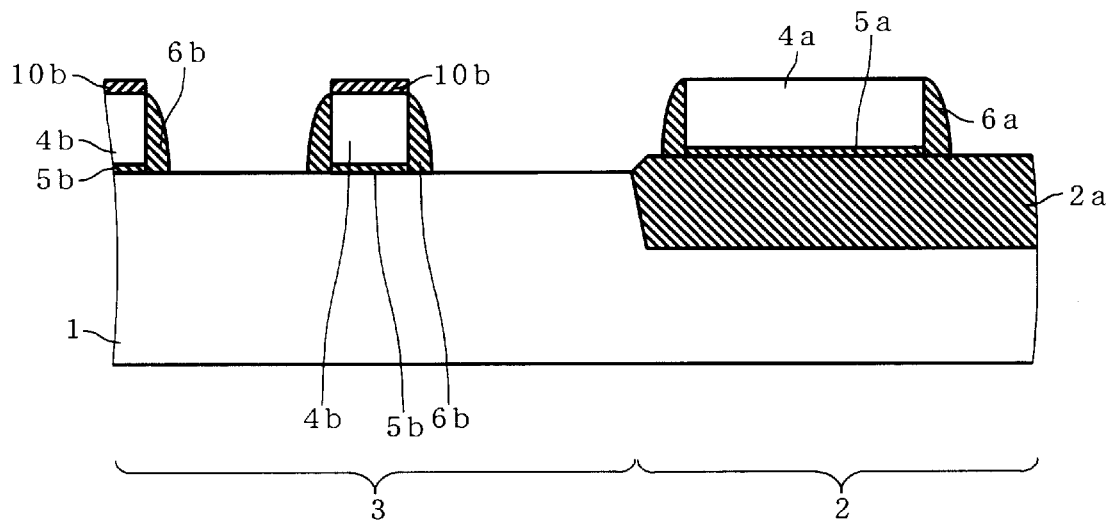
FIGS. 25A and 25B show a structure of the semiconductor device according to an eighth preferred embodiment of the present invention.

FIG. 25A shows a structure of the semiconductor device according to an eighth preferred embodiment of the present invention. The structure of the semiconductor device of FIG. 25A differs from that of the semiconductor device of FIG. 1A in that the insulation film 9 is not formed and that the stopper films 10b are smaller in width. The width of each of the stopper films 10b of the first preferred embodiment approximately equals the sum of the widths of its associated gate electrode 4b and its associated sidewalls 6b. On the other hand, the width of each of the stopper films 10b of the eighth preferred embodiment approximately equals the width of its associated gate electrode 4b.

Figure 25B:
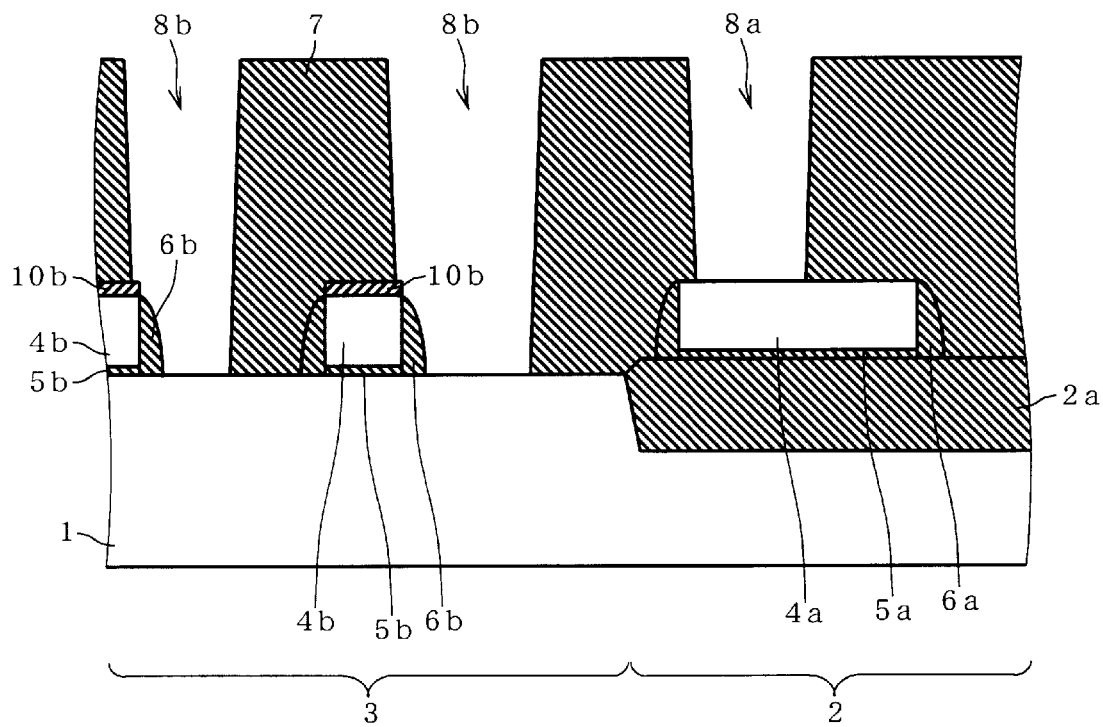

With such an arrangement, the stopper films 10b prevent the gate electrodes 4b from being exposed to the contact holes 8b (FIG. 25B). The eighth preferred embodiment is similar in effect to the first preferred embodiment.

Ninth Preferred Embodiment

Figure 26A:
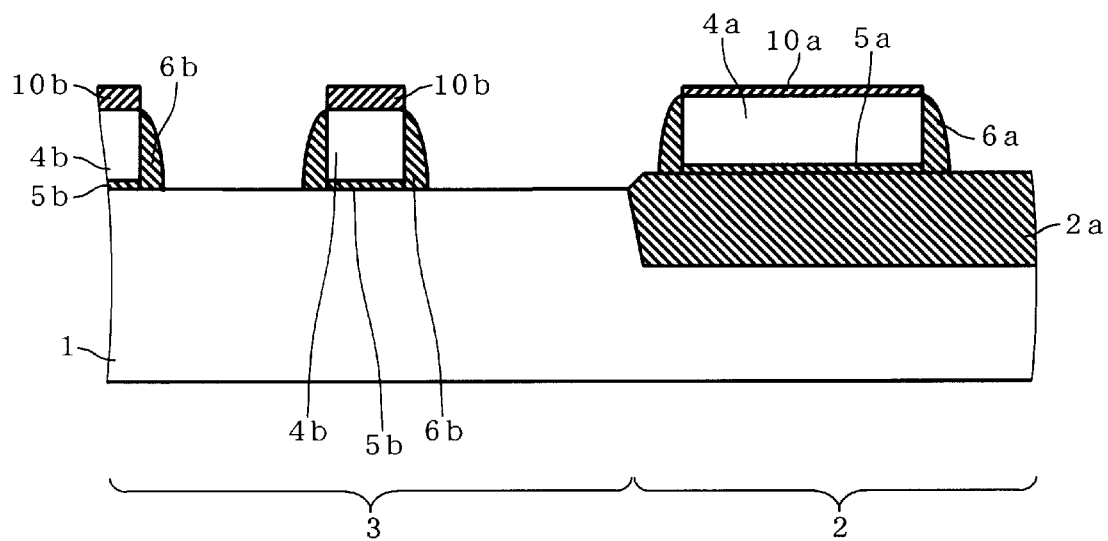
FIGS. 26A and 26B show a structure of the semiconductor device according to a ninth preferred embodiment of the present invention.

FIG. 26A shows a structure of the semiconductor device according to a ninth preferred embodiment of the present invention. The structure of the semiconductor device shown in FIG. 26A is generally similar to that of the semiconductor device shown in FIG. 25A except that the stopper film 10a thinner than the stopper films 10b is formed on the interconnect line 4a.

Figure 26B:
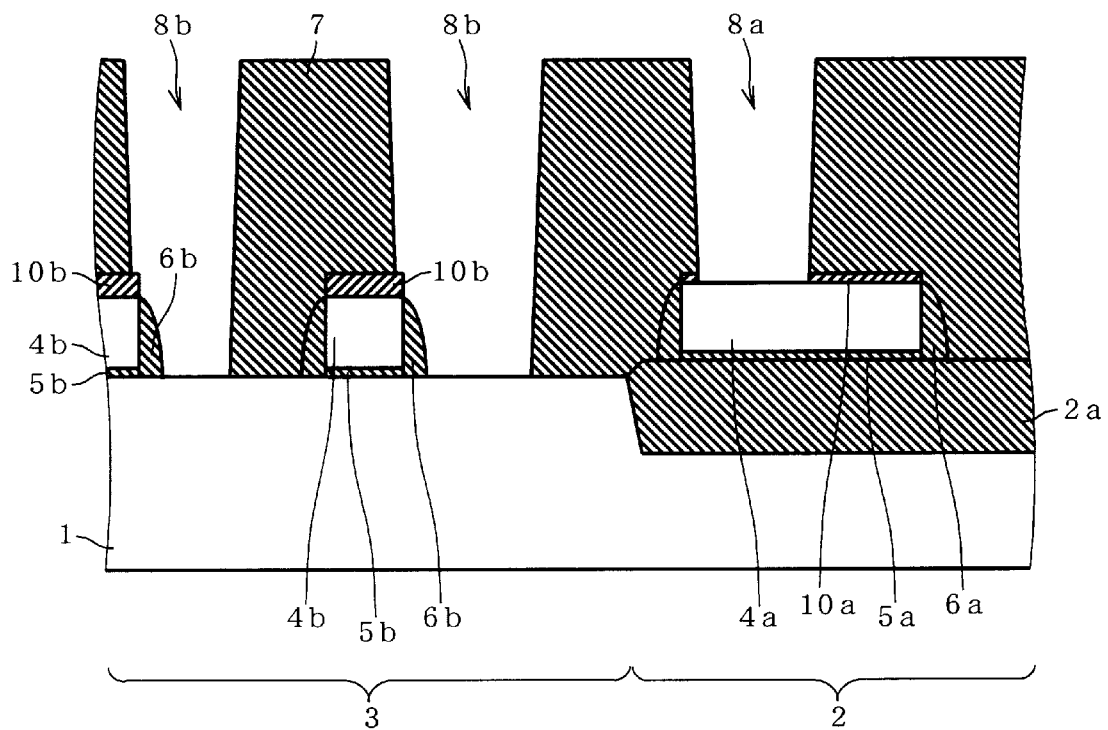

The stopper film 10a is formed to cover the entire top surface of the interconnect line 4a. However, because of its thinness, the stopper film 10a which faces the contact hole 8a is easy to remove during the formation of the contact hole 8a (FIG. 26B). Thus, the structure of the ninth preferred embodiment may expose the interconnect line 4a to the contact hole 8a more easily than the structure of the first preferred embodiment shown in FIG. 1A.

Tenth Preferred Embodiment

Figure 27:
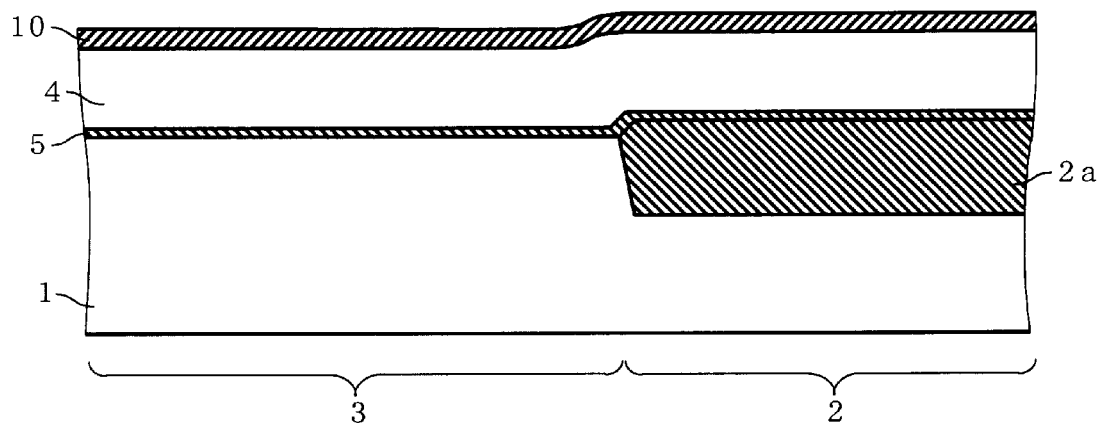
FIGS. 27 through 30, 31A, and 31B show respective steps of the method according to a tenth preferred embodiment of the present invention.
Figure 28:
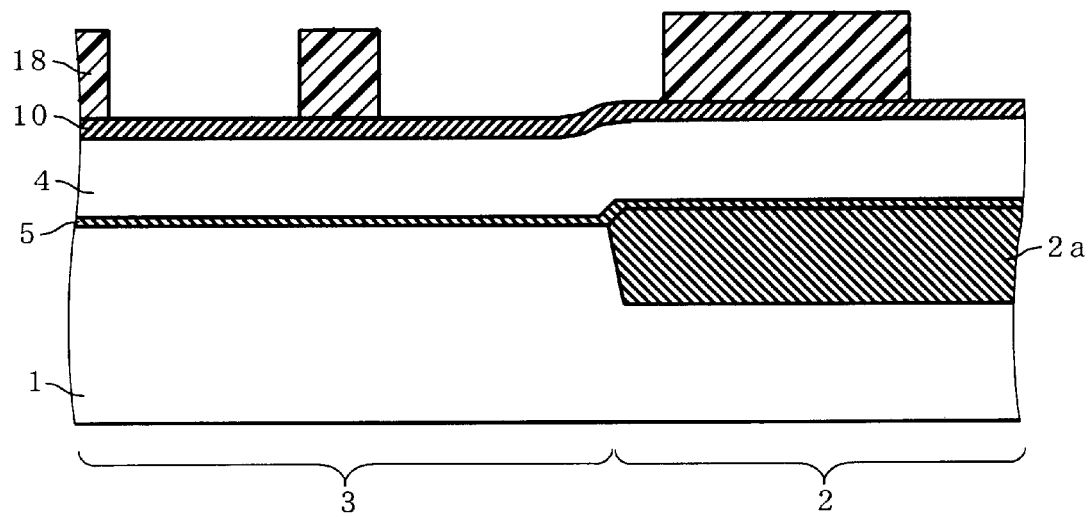

The stopper film 10 made of, for example, silicon nitride is formed to cover the entire top surface of the structure shown in FIG. 2 in the method of the second preferred embodiment (FIG. 27). The photoresist 18 is applied to the stopper film 10 and then patterned for the interconnect line and the gate electrodes, using a photomask (not shown) for the formation of the interconnect line and the gate electrodes (FIG. 28). The pattern provided herein is identical with that of the second preferred embodiment show in FIG. 3.

Figure 29:
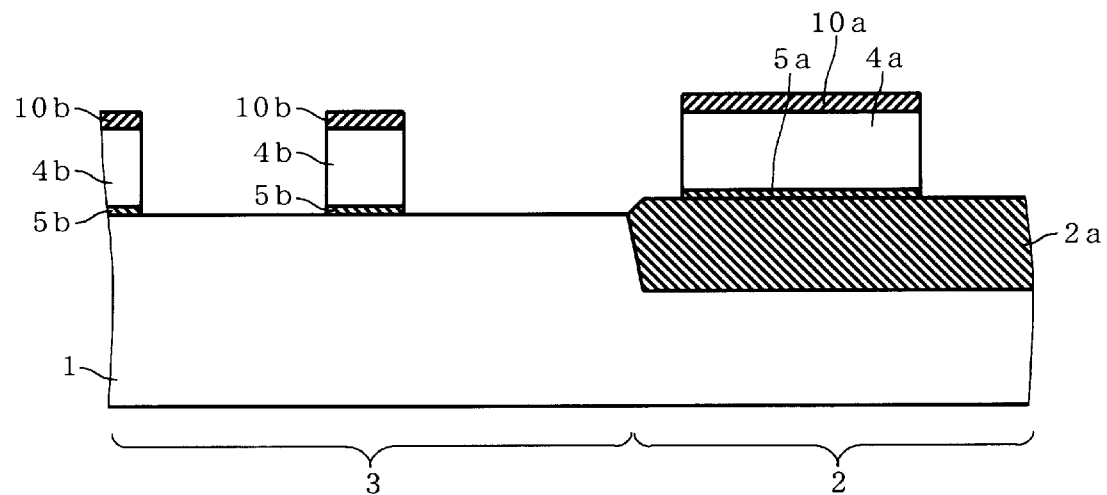

The gate insulation film 5, the conductive material 4 and the stopper film 10 are etched using the photoresist 18 as a mask to form the gate insulation films 5a and 5b, the gate electrodes 4b, the interconnect line 4a, and the stopper films 10a and 10b (FIG. 29). Impurities are implanted into the active region 3 using the gate insulation films 5a and 5b, the gate electrodes 4b, the interconnect line 4a and the stopper films 10a and 10b as a mask to form the source and drain regions (not shown).

Figure 30:
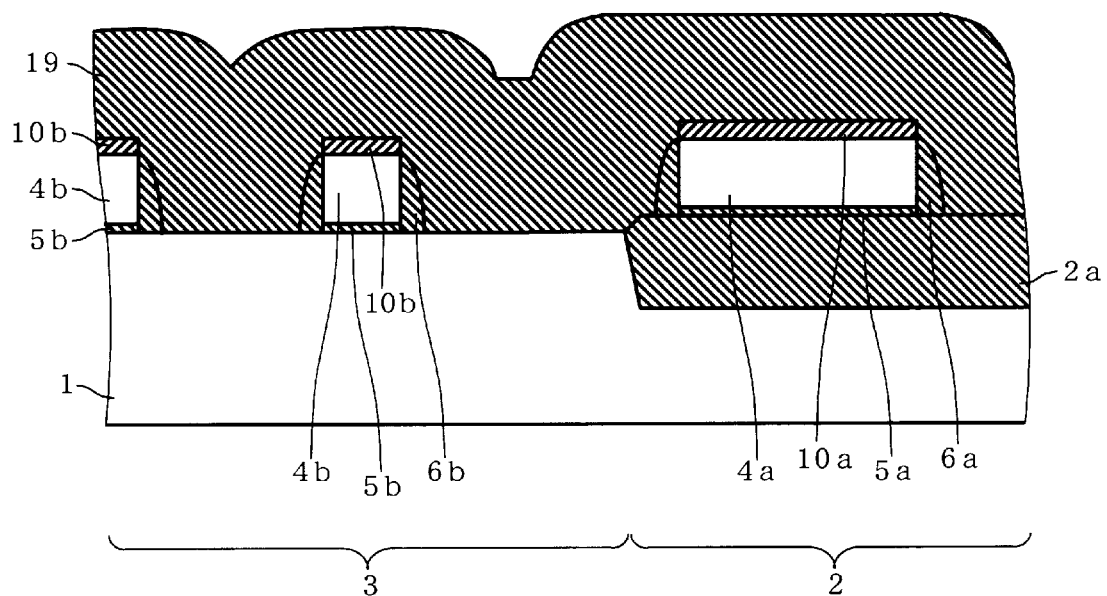

The sidewalls 6a are formed on opposite sides of the gate insulation film 5a and the interconnect line 4a, and the sidewalls 6b are formed on opposite sides of the gate insulation films 5b and the gate electrodes 4b. An insulation film 19 is deposited on the entire top surface of the resultant structure (FIG. 30).

Figure 31A:
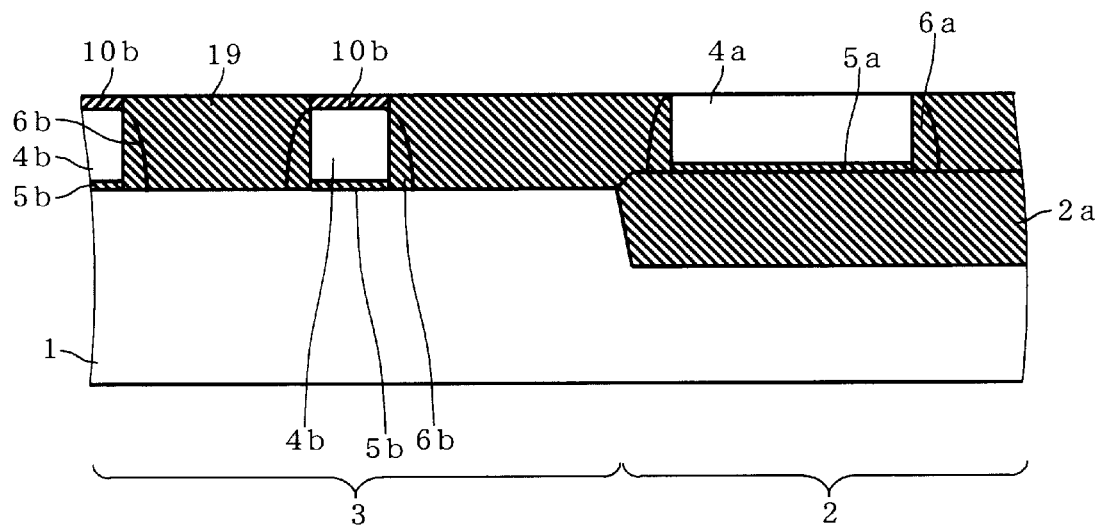

Polishing the surface of the resultant structure by the CMP process removes the stopper film 10a over the element isolation region 2 (FIG. 31A). During the polishing, the insulation film 19 filling the space between minute structures such as the gate electrodes 4b may avoid the removal of such minute structures from the surface of the semiconductor substrate 1 because of the force of the polishing.

The presence of the level difference between the active region 3 and the element isolation region 2 permits the surface polishing by the CMP process to remove only the stopper film 10a over the element isolation region 2, with the stopper films 10b left over the active region 3, to provide the structure shown in FIG. 25A with the insulation film 19 buried therein. The insulation film 19, similar to the interlayer insulation film 7 to be deposited later, must be etched when the contact holes 8a and 8b are formed. It is therefore desirable that the insulation film 19 is made of the same material as the interlayer insulation film 7 when a silicon oxide based material is used as the material of the interlayer insulation film 7.

Figure 31B:
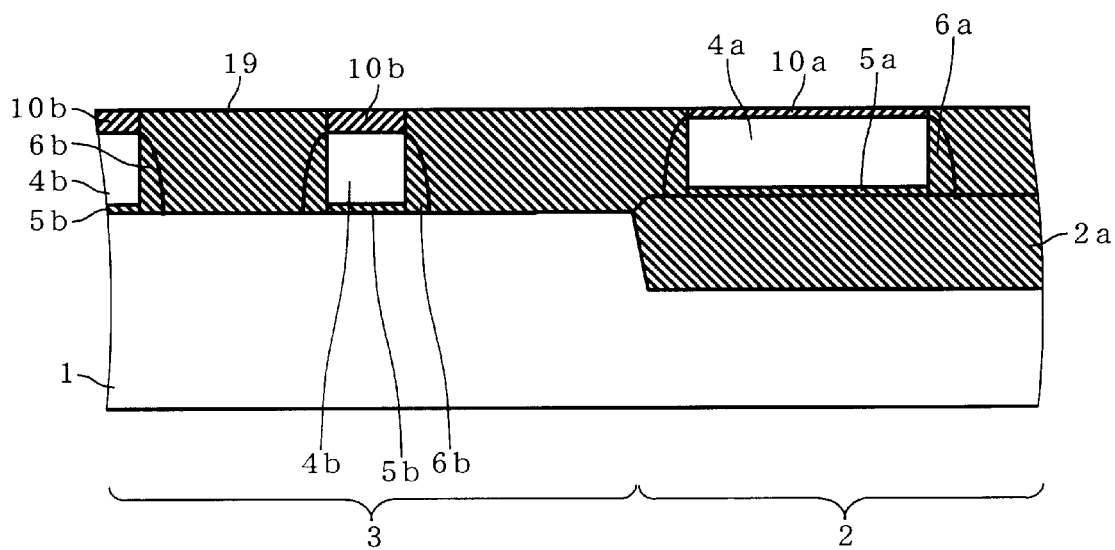

There is a danger that the planarization by the CMP process completely removes the stopper films 10b over the active region 3 if the amount of etching is difficult to control or the semiconductor substrate 1 is distorted. In such cases, the polishing may be performed until the stopper film 10a over the element isolation region 2 remains thin as shown in FIG. 31B to provide the structure shown in FIG. 26A with the insulation film 19 buried therein. The stopper films 10b are considered as being substantially positively left over the active region 3 when the stopper film 10a is left over the element isolation region 2.

The method of the tenth preferred embodiment may completely or substantially remove the stopper film 10a left over the element isolation region 2 by the CMP process to readily manufacture the semiconductor device shown in FIG. 25A or FIG. 26A.

Eleventh Preferred Embodiment

Figure 32A:
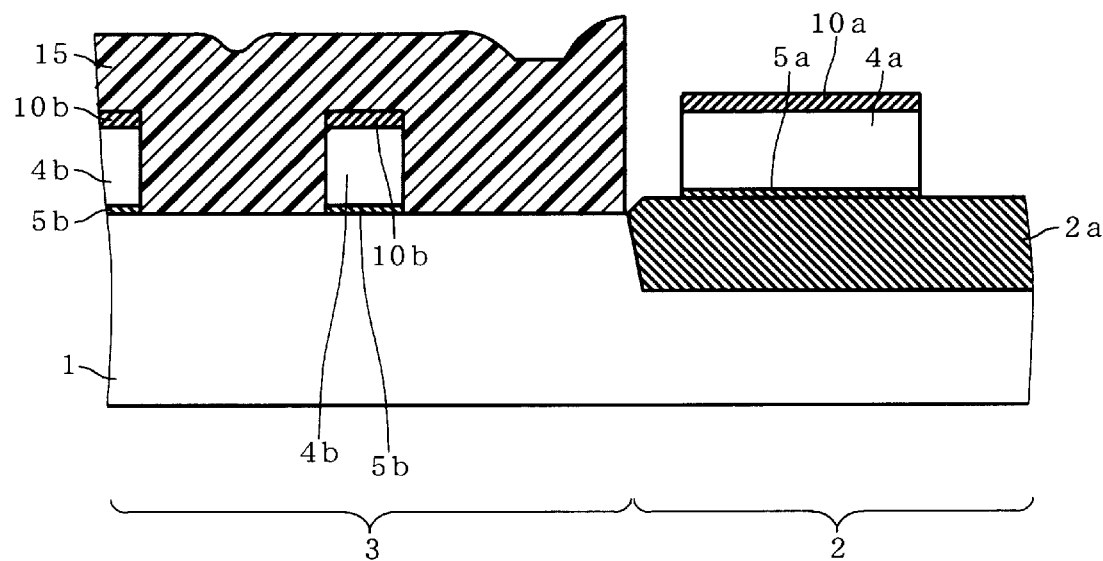
FIGS. 32A and 32B show respective steps of the method according to an eleventh preferred embodiment of the present invention.
Figure 32B:
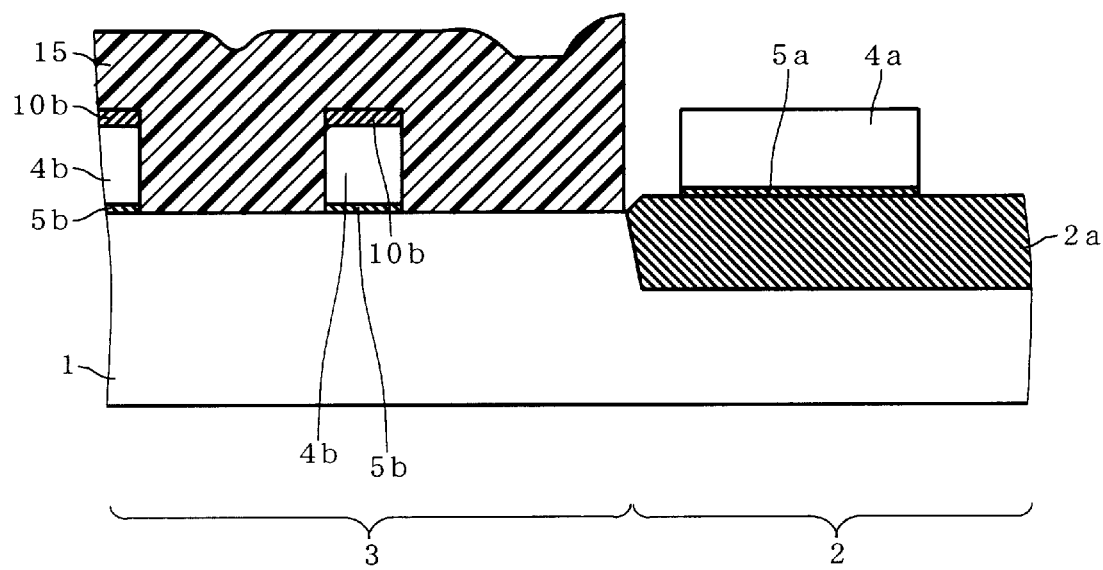

The semiconductor device shown in FIG. 29 is manufactured in a manner described in the tenth preferred embodiment. The photoresist 15 illustrated in the sixth preferred embodiment is formed on the active region 3 using a photomask for the formation of the element isolation region 2 (FIG. 32A). The stopper film 10a over the element isolation region 2 is removed by etching (FIG. 32B).

The photoresist 15 is removed, and the sidewalls 6a and 6b are formed. Then, the semiconductor device shown in FIG. 25A is manufactured.

The method of the eleventh preferred embodiment of the present invention insures the removal of the stopper film 10a over the element isolation region 2, with the stopper films 10b reliably left over the active region 3, without the increase in the number of required masks.

Twelfth Preferred Embodiment

Figure 33A:
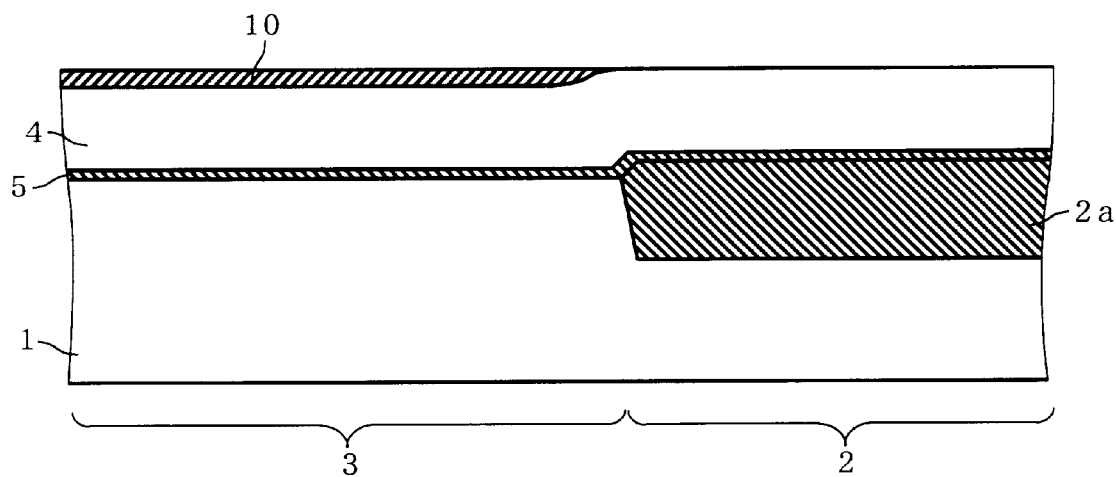
FIGS. 33A and 33B show respective steps of the method according to a twelfth preferred embodiment of the present invention.
Figure 33B:
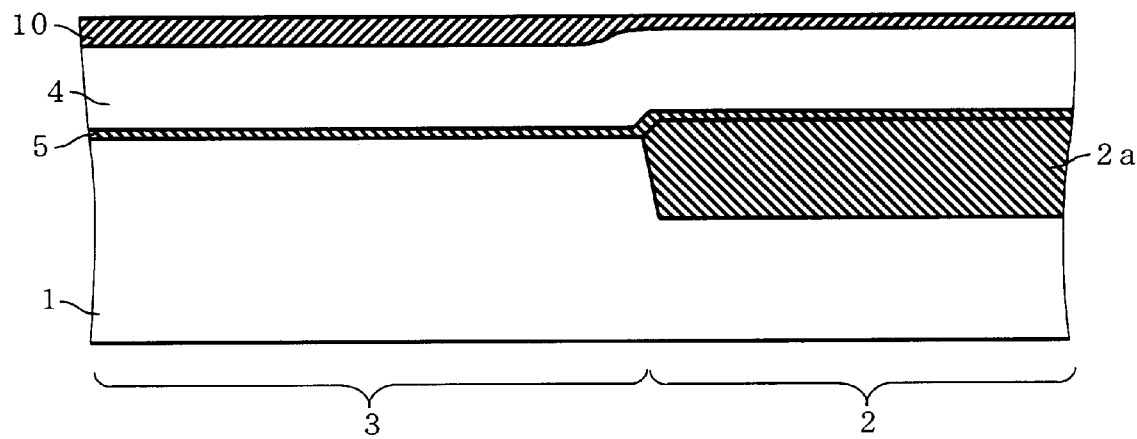

The semiconductor device shown in FIG. 27 is manufactured in a manner described in the tenth preferred embodiment. Polishing the surface of the resultant structure by the CMP process removes the stopper film 10 over the element isolation region 2 (FIG. 33A). During the polishing, the level difference between the active region 3 and the element isolation region 2 is utilized to remove only the stopper film 10 over the element isolation region 2, with the stopper film 10 left over the active region 3. There is a danger that the planarization by the CMP process completely removes the stopper film 10 over the active region 3 if the amount of etching is difficult to control or the semiconductor substrate 1 is distorted. In such cases, the polishing may be performed until the stopper film 10 over the element isolation region 2 remains thin as shown in FIG. 33B, and the remaining stopper film 10 may be etched when the contact hole 8a is formed after the formation of the interlayer insulation film 7.

Subsequently, the steps shown in FIGS. 28 and 29 in the tenth preferred embodiment are performed, and the sidewalls 6a and 6b are formed. Then, the semiconductor device shown in FIG. 25A is manufactured.

The method of the twelfth preferred embodiment may provide the effects of the tenth preferred embodiment without the need to form the insulation film 19.

Thirteenth Preferred Embodiment

Figure 34A:
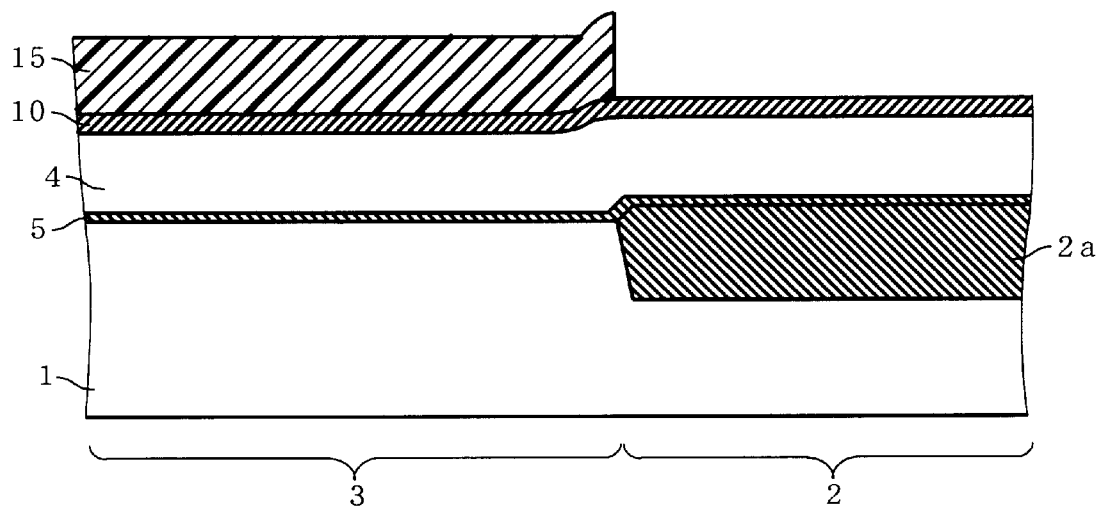
FIGS. 34A and 34B show respective steps of the method according to a thirteenth preferred embodiment of the present invention.
Figure 34B:
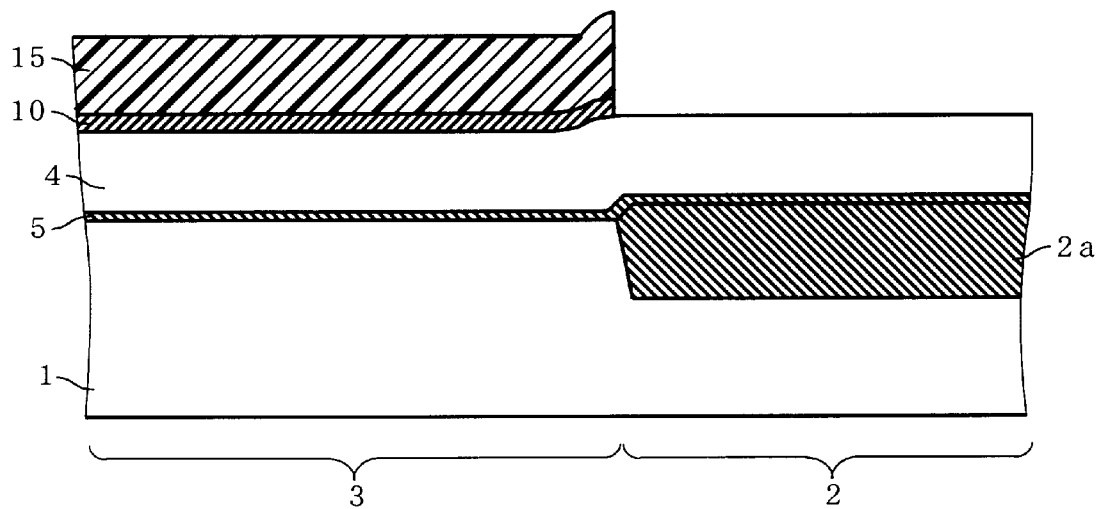

The semiconductor device shown in FIG. 27 is manufactured in a manner described in the tenth preferred embodiment. The photoresist 15 illustrated in the sixth preferred embodiment is formed over the active region 3 using a photomask for the formation of the element isolation region 2 (FIG. 34A). The stopper film 10 over the element isolation region 2 is removed by etching (FIG. 34B).

Subsequently, the steps shown in FIGS. 28 and 29 in the tenth preferred embodiment are performed, and the sidewalls 6a and 6b are formed. Then, the semiconductor device shown in FIG. 25A is manufactured.

The method of the thirteenth preferred embodiment may provide the effects of the tenth preferred embodiment without the need to form the insulation film 19. Additionally, the method of the thirteenth preferred embodiment insures the removal of the stopper film 10 over the element isolation region 2, with the stopper film 10 reliably left over the active region 3.

Fourteenth Preferred Embodiment

Figure 35A:
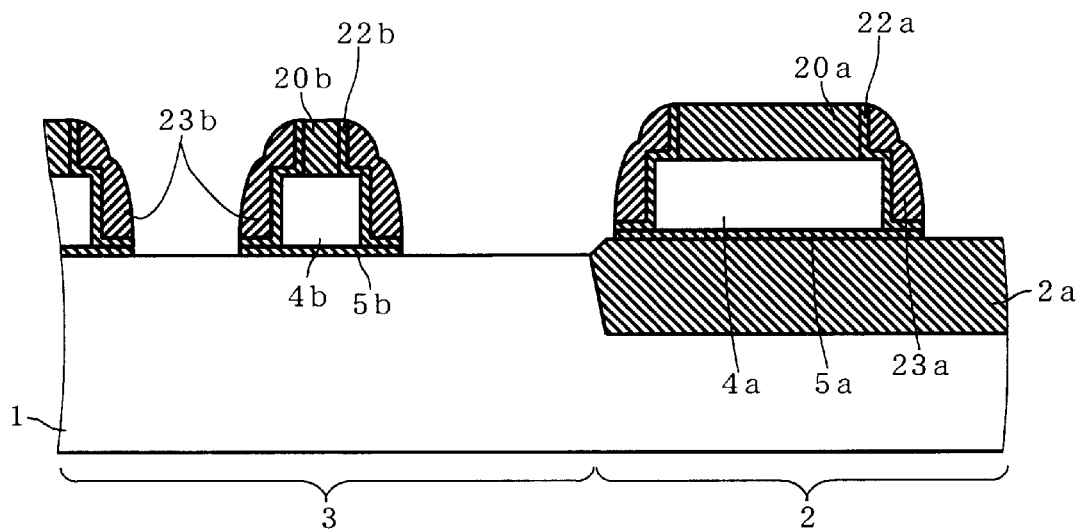
FIGS. 35A and 35B show a structure of the semiconductor device according to a fourteenth preferred embodiment of the present invention.

FIG. 35A shows a structure of the semiconductor device according to a fourteenth preferred embodiment of the present invention.

In the semiconductor device of FIG. 35A, the surface of the semiconductor substrate 1 is divided into the element isolation region 2 and the active region 3. The isolation element 2a employing the LOCOS process or a trench is formed in the element isolation region 2. The gate insulation film 5a is formed on the surface of the isolation element 2a, and the interconnect line 4a is formed on the gate insulation film 5a. The gate insulation films 5b are formed on the surface of the active region 3, and the gate electrodes 4b are formed on the respective gate insulation films 5b. Insulation films 20a and 20b having a thickness of about 850 angstroms are formed on the top surfaces of the interconnect line 4a and the gate electrodes 4b, respectively. The width of the insulation film 20a is slightly less than that of the interconnect line 4a, and the width of the insulation films 20b is slightly less than that of the gate electrodes 4b.

Inner sidewalls 22a having a thickness of about 150 angstroms and made of a silicon oxide based material, for example, are formed to cover the side faces of the insulation film 20a, the side faces of the interconnect line 4a, and part of the top surface of the interconnect line 4a which is not covered with the insulation film 20a. Inner sidewalls 22b having a thickness of about 150 angstroms and made of a silicon oxide based material, for example, are formed to cover the side faces of the insulation films 20b, the side faces of the gate electrodes 4b, and part of the top surface of the gate electrodes 4b which is not covered with the insulation films 20b. Stopper sidewalls 23a and 23b made of, for example, silicon nitride are formed outside the inner sidewalls 22a and 22b, respectively.

Figure 35B:
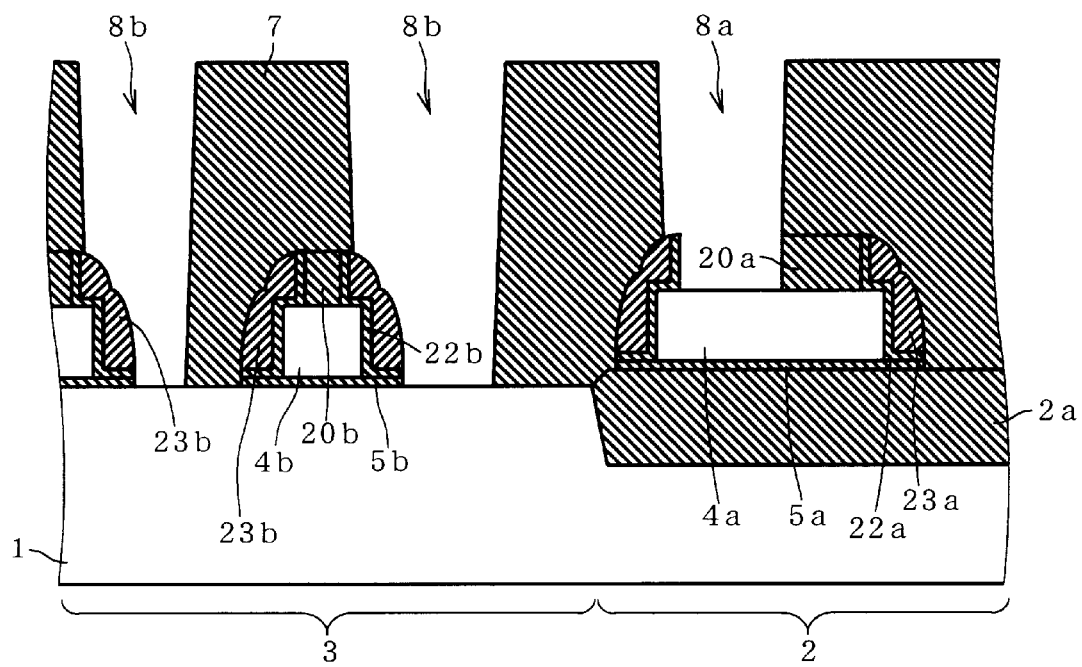

FIG. 35B shows the structure of the semiconductor device when the contact holes 8a and 8b are formed in the interlayer insulation film 7 formed on the structure shown in FIG. 35A but are not positioned as designed such as shown in FIG. 43B or FIG. 43C. In the structure of the semiconductor device of FIG. 35B, the sidewalls 23a and 23b perform the functions of the stopper films 10a and 10b of the first to thirteenth preferred embodiments. The formation of the insulation film 20a made of the same material as the interlayer insulation film 7, e.g., a silicon oxide based material facilitates the formation of the contact hole 8a on the interconnect line 4a.

The inner sidewalls 22a and 22b prevent the stopper sidewalls 23a and 23b made of silicon nitride from directly contacting the interconnect line 4a and the gate electrodes 4b made of polysilicon and the like since the conductive characteristics of polysilicon deteriorates if the polysilicon contacts silicon nitride. Also in a structure which does not include the inner sidewalls 22a and 22b, the sidewalls 23a and 23b are not prevented from performing the functions of the stopper films 10a and 10b of the first to thirteenth preferred embodiments.

The use of the semiconductor device of the fourteenth preferred embodiment precludes the gate electrodes 4b from being exposed to the contact holes 8b when the contact holes 8b are formed. It is, however, desirable to form the insulation films 20a and 20b in the same step in terms of simplification of the steps. Thus, the insulation films 20b, similar to the insulation film 20a, are made of the silicon oxide based material, for example. It is therefore desirable that the position shift of the contact holes 8b falls within a range in which the stopper sidewalls 23b are present.

Fifteenth Preferred Embodiment

A fifteenth preferred embodiment according to the present invention relates to the method of manufacturing the semiconductor device shown in FIG. 35A. Since the manufacturing method for the element isolation region 2 is completely identical with that for the active region 3, only the active region 3 will be illustrated for purposes of simplification.

Figure 36:
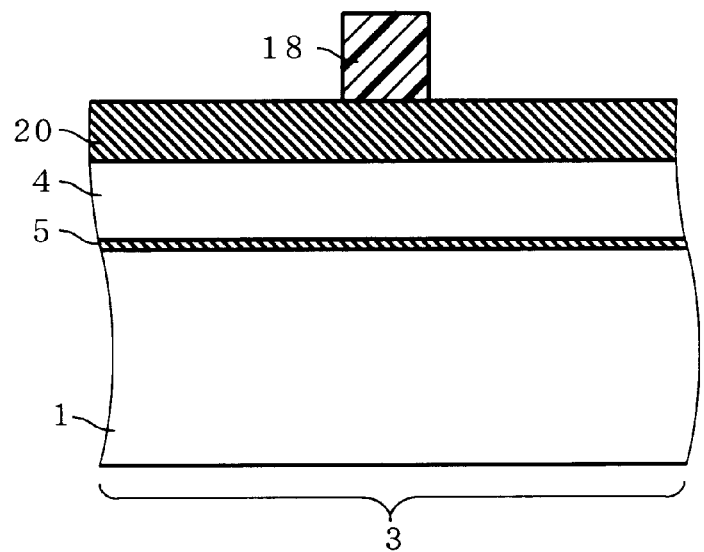
FIGS. 36 through 42 show respective steps of the method according to a fifteenth preferred embodiment of the present invention.
Figure 37:
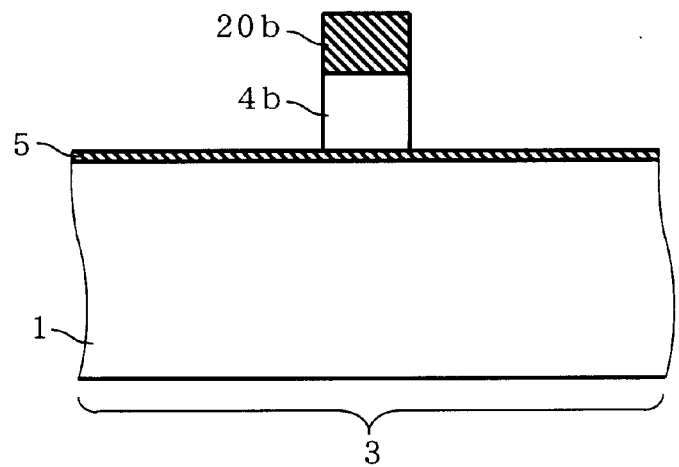

The gate oxide film 5, the conductive material 4 for the formation of the interconnect line or a gate electrode, and an insulation film material 20 are stacked in the order named on the entire top surface of the semiconductor substrate 1, and a photoresist 18 is patterned only in a position where the gate electrode is to be produced (FIG. 36). The conductive material 4 and the insulation film material 20 are etched using the photoresist 18 as a mask to pattern the gate electrode 4b and the insulation film 20b (FIG. 37).

Figure 38:
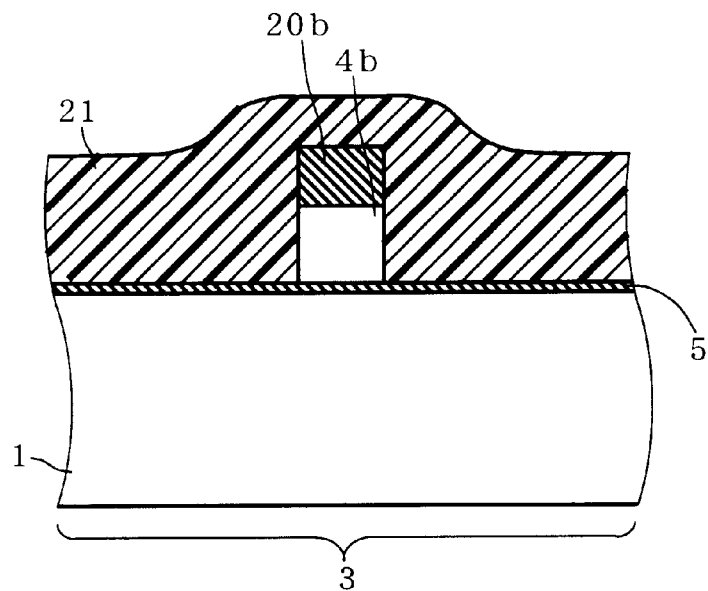
Figure 39:
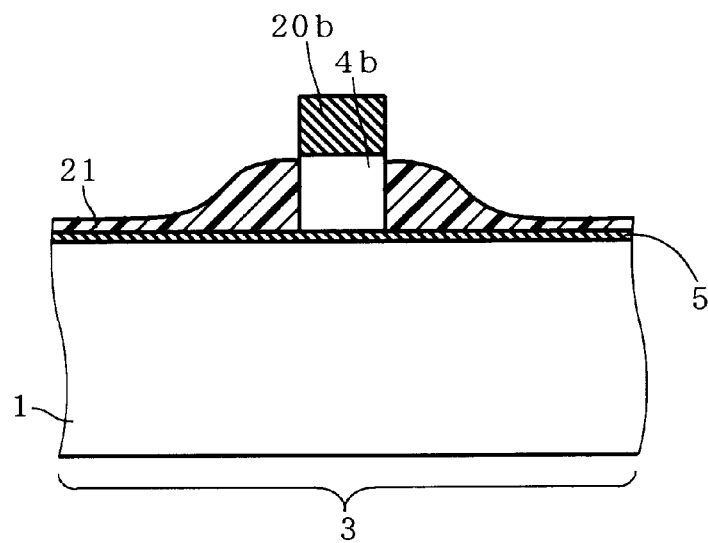

An organic material 21 is applied to the entire top surface of the resultant structure (FIG. 38). The organic material 21 is thinner over the gate electrode 4b because of its good step coverage. Thus, when the entire top surface of the organic material 21 is etched back until the insulation film 20b is exposed, the organic material 21 may be left without exposing the gate oxide film 5 (FIG. 39). Therefore, only the insulation film 20b may be reduced in width by wet etching (FIG. 40).

Figure 40:
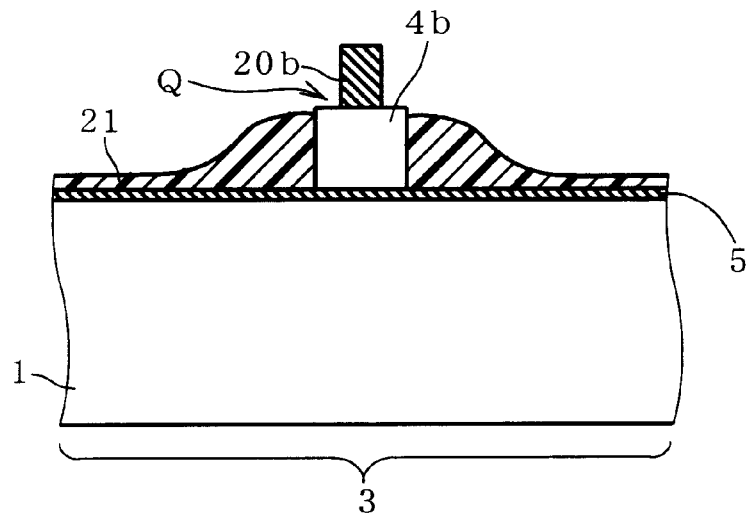
Figure 41:
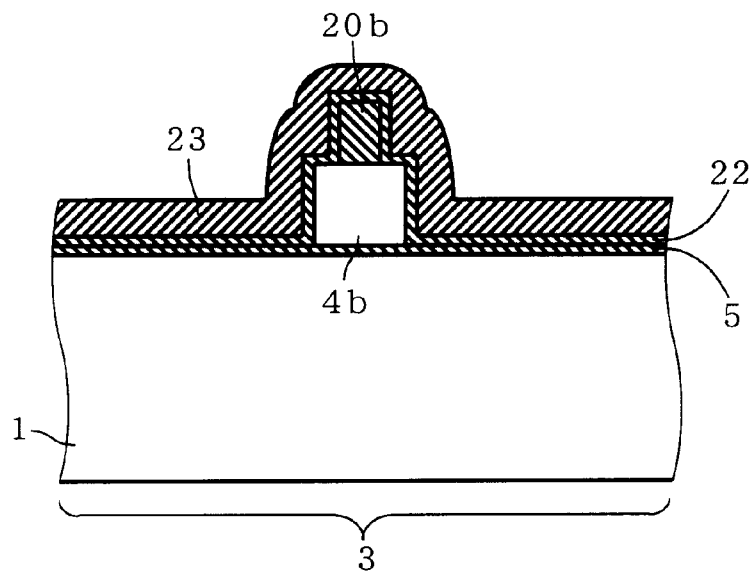
Figure 42:
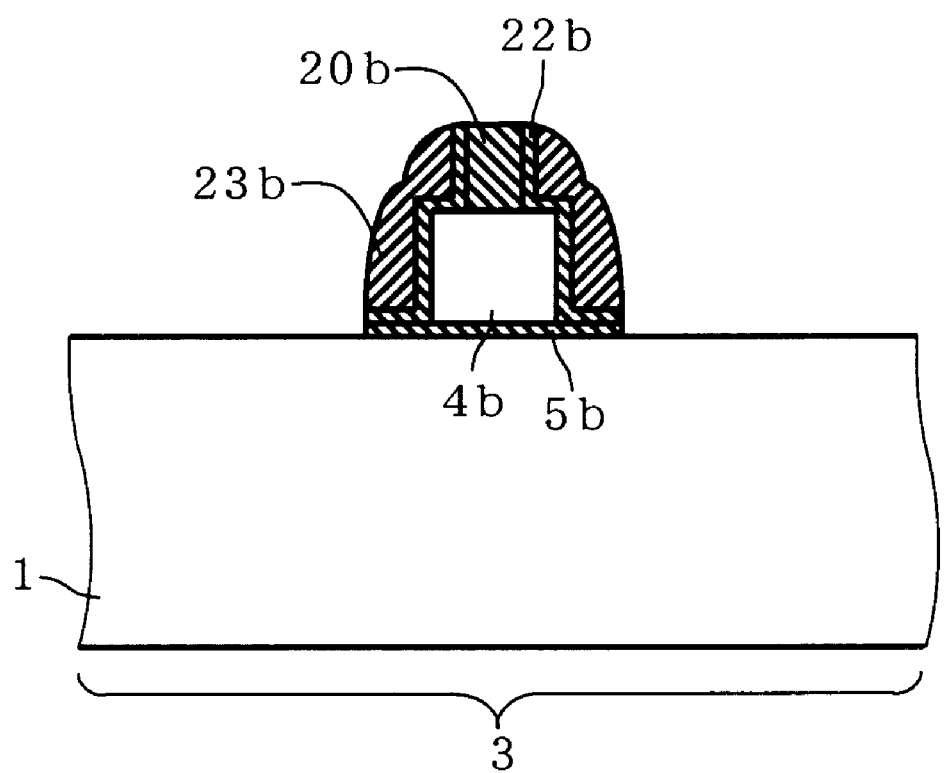

A silicon oxide film 22 and a silicon nitride film 23 are stacked in the order named to cover the entire top surface of the structure shown in FIG. 40 without the organic material 21 (FIG. 41). Etching back the entire top surface of the resultant structure exposes the active region 3 and the insulation film 20b to form the inner sidewalls 22b and the stopper sidewalls 23b (FIG. 42).

The function of the insulation film 20b will be discussed below. In the absence of the insulation film 20b, the silicon nitride film 23 is formed uniformly on the top surface of the gate electrode 4b. Then, the stopper sidewalls 23b are not formed on the top surface of the gate electrode 4b when the etch back is performed, and the gate electrode 4b is not prevented from being exposed to the contact hole 8b. In the presence of the insulation film 20b, on the other hand, a stepped portion Q defined by the top surface of the gate electrode 4b and a side face of the insulation film 20b is produced. The silicon nitride film 23 in the stepped portion Q is thicker than that over the insulation film 20b. This allows the stopper sidewalls 23b to cover part of the top surface of the gate electrode 4b which is not covered with the insulation film 20b.

The method of the fifteenth preferred embodiment permits the stopper sidewalls 23b to widely cover the side faces of the gate electrode 4b and the part of the top surface thereof since the insulation film 20b is formed previously.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device comprising the steps of:
    (a) forming an electrode in a first region of a surface of a semiconductor substrate from which said electrode is insulated;
    (b) stacking an insulative stopper film and a mask layer including a first layer and a second layer in the order named which cover said electrode and said surface of said semiconductor substrate at least in said first region;
    (c) opening said second layer in a self-aligned manner over said electrode;
    (d) changing a property of a surface of said first layer using the opened second layer as a mask to form a property-changed layer, with said first layer left unchanged in property under said property-changed layer;
    (e) selectively removing said first layer by etching using said property-changed layer as a mask; and
    (f) selectively removing said stopper film by etching using said first layer left in said step (e) as a mask.

2. The method according to claim 1,
    wherein said stopper film and said second layer are made of silicon nitride, said first layer is made of polysilicon, and said property-changed layer is made of polysilicon oxide.

3. The method according to claim 1,
    wherein said mask layer further includes a third layer on opposite side of said second layer from said first layer,
    said third layer being relatively thick over said semiconductor substrate and being relatively thin over said electrode, and
    wherein said step (c) comprises the steps of:
        (c-1) etching back the entire surface of said third layer to expose said second layer; and
        (c-2) selectively removing said second layer by etching using said third layer as a mask.

4. The method according to claim 3,
    wherein said third layer is made of an organic material.

5. The method according to claim 1,
    wherein said step (c) comprises the step of
        (c-1) polishing said second layer.

6. The method according to claim 5,
    wherein said polishing is performed by CMP process.

7. The method according to claim 1,
    wherein said step (a) comprises the step of
        (a-1) forming an isolation element raised from said surface of said semiconductor substrate in a second region of said surface of said semiconductor substrate to form an interconnect line on said isolation element, said second region being other than said first region of said surface of said semiconductor substrate, and
    wherein said insulative stopper film and said mask layer are further stacked on said interconnect line, and
    wherein said step (c) comprises the step of
        (c-1) opening said second layer in a self-aligned manner over said electrode and said interconnect line,
    said method further comprising the steps of:
        (g) forming an insulation film on said insulative stopper film;
        (h) performing first etching for complete removing of said stopper film over said second region in its thickness direction, with said stopper film over said first region not completely removed in its thickness direction; and
        (i) performing second etching for removing said insulation film to expose said surface of said semiconductor substrate in said first region and said interconnect line.

8. The method according to claim 1,
    wherein said step (a) comprises the step of
        (a-1) forming an isolation element raised from said surface of said semiconductor substrate in a second region of said surface of said semiconductor substrate to form an interconnect line on said isolation element, said second region being other than said first region of said surface of said semiconductor substrate, and wherein said insulative stopper film and said mask layer are further stacked on said interconnect line, and wherein said step (c) comprises the step of
(c-1) opening said second layer in a self-aligned manner over said electrode and said interconnect line, said method further comprising the steps of:
(g) forming an insulation film on said insulative stopper film; and
(h) selectively removing said insulation film by etching to expose said surface of said semiconductor substrate in said first region and said interconnect line,
wherein the thickness of said stopper film is greater than r/(1−r) times the thickness of said electrode where r is a ratio of the etch rate of said stopper film to the etch rate of said insulation film in said etching performed in said step (h) and is less than 1.

9. The method according to claim 1,
wherein said step (a) comprises the step of
(a-1) forming an isolation element in a second region of said surface of said semiconductor substrate to form an interconnect line on said isolation element, said second region being other than said first region of said surface of said semiconductor substrate, and
wherein said insulative stopper film and said mask layer are further stacked on said interconnect line, and wherein said step (c) comprises the step of
(c-1) opening said second layer in a self-aligned manner over said electrode and said interconnect line, said method further comprising the steps of:
(g) forming an insulation film on said insulative stopper film; and
(h) selectively removing said insulation film by etching separately over said first region and over said second region to expose said surface of said semiconductor substrate in said first region and said interconnect line.

10. The method according to claim 1,
wherein said step (a) comprises the step of
(a-1) forming an isolation element in a second region of said surface of said semiconductor substrate to form an interconnect line on said isolation element, said second region being other than said first region of said surface of said semiconductor substrate, and
wherein said insulative stopper film and said mask layer are further stacked on said interconnect line, and wherein said step (c) comprises the step of
(c-1) opening said second layer in a self-aligned manner over said electrode and said interconnect line, said method further comprising the step of
(g) forming a mask covering said first region to remove said stopper film over said second region.

11. A method of manufacturing a semiconductor device comprising the steps of:
(a) preparing a semiconductor substrate having a surface divided into a first region and a second region;
(b) stacking an electrode and a stopper film in the order named on said semiconductor substrate from which said electrode is insulated;
(c) selectively removing said electrode and said stopper film to form a first multilayer structure including said electrode and said stopper film which are arranged in a stacked relation in the order named on said first region and a second multilayer structure including said electrode and said stopper film which are arranged in a stacked relation in the order named on said second region, said first and second multilayer structures being positioned in spaced apart relation with each other; and
(d) reducing the thickness of said stopper film over said second region to a thickness less than the thickness of said stopper film over said first region.

12. The method according to claim 11,
wherein said step (a) comprises the step of
(a-1) forming an isolation element raised from said surface of said semiconductor substrate in said second region,
wherein said step (d) is performed after said step (c), and wherein said step (d) comprises the steps of:
(d-1) forming an insulative material for filling space between said first and second multilayer structures; and
(d-2) polishing said insulative material and said stopper film to expose said first multilayer structure.

13. The method according to claim 12,
wherein said polishing is performed by CMP process.

14. The method according to claim 11,
wherein said step (a) comprises the step of
(a-1) forming an isolation element raised from said surface of said semiconductor substrate in said second region,
wherein said step (d) is performed before said step (c), and wherein said step (d) comprises the step of:
(d-1) polishing said stopper film.

15. The method according to claim 14,
wherein said polishing is performed by CMP process.

16. The method according to claim 11,
wherein said step (a) comprises the step of
(a-1) forming an isolation element in said second region,
wherein said step (d) is performed after said step (c), and wherein said step (d) comprises the steps of:
(d-1) forming a mask covering only said first region; and
(d-2) etching said stopper film using said mask.

17. The method according to claim 11,
wherein said step (a) comprises the step of
(a-1) forming an isolation element in said second region,
wherein said step (d) is performed before said step (c), and wherein said step (d) comprises the steps of:
(d-1) forming a mask covering only said first region; and
(d-2) etching said stopper film using said mask.

18. A method of manufacturing a semiconductor device comprising the steps of:
(a) forming a first insulation film on a surface of a semiconductor substrate, and forming an electrode on said first insulation film, with a second insulation film formed on said electrode;
(b) forming a mask layer on said first and second insulation films, said mask layer being thinner over said second insulation film than on a surface of said first insulation film;
(c) etching back the entire surface of said mask layer to expose said second insulation film, with said first insulation film covered with said mask layer;
(d) reducing the width of said second insulation film to provide a stepped portion defined between said second insulation film and said electrode;

(e) forming a third insulation film on said mask layer and said electrode and said second insulation layer; and (f) etching back the entire surface of said third insulation film to leave parts of said third insulation film which cover the side faces of said electrode, part of the top surface of said electrode which is not covered with said second insulation film, and the side faces of said second insulation film.

* * * * *